United States Patent
Zhu et al.

(10) Patent No.: US 9,998,145 B2
(45) Date of Patent: Jun. 12, 2018

(54) DATA PROCESSING METHOD AND DEVICE

(71) Applicant: Huawei Technologies Co., Ltd., Shenzhen (CN)

(72) Inventors: Jinwei Zhu, Beijing (CN); Long Yan, Shenzhen (CN); Qingqing Zhou, Santa Clara, CA (US)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days. days.

(21) Appl. No.: 15/668,335

(22) Filed: Aug. 3, 2017

(65) Prior Publication Data
US 2017/0331492 A1 Nov. 16, 2017

Related U.S. Application Data

(63) Continuation of application No. PCT/CN2016/070805, filed on Jan. 13, 2016.

(30) Foreign Application Priority Data

Feb. 4, 2015 (CN) .......................... 2015 1 0059809

(51) Int. Cl.
*H03M 7/00* (2006.01)
*H03M 7/40* (2006.01)
(Continued)

(52) U.S. Cl.
CPC ........ *H03M 7/4006* (2013.01); *G06F 3/0608* (2013.01); *G06F 7/08* (2013.01); *G06F 17/30542* (2013.01)

(58) Field of Classification Search
CPC ...... H03M 7/4006; G06F 3/0608; G06F 7/08; G06F 17/30542
(Continued)

(56) References Cited

U.S. PATENT DOCUMENTS

| | | | | |
|---|---|---|---|---|
| 5,650,783 A | * | 7/1997 | Murashita | ............... G06T 9/005 341/107 |
| 5,872,530 A | | 2/1999 | Domyo et al. | |

(Continued)

FOREIGN PATENT DOCUMENTS

| | | |
|---|---|---|
| CN | 1167951 A | 12/1997 |
| CN | 1695168 A | 11/2005 |

(Continued)

OTHER PUBLICATIONS

Marpe, D. et al.,"Context-Based Adaptive Binary Arithmetic Coding in the H.264/AVC Video Compression Standard," IEEE Transactions an Circuits and Systems for Video Technology, vol. 13, No. 7, XP055120073, Jul. 2003, 18 pages.
(Continued)

*Primary Examiner* — Khai M Nguyen
(74) *Attorney, Agent, or Firm* — Slater Matsil, LLP

(57) ABSTRACT

A data processing method and device are provided, where the method includes encoding data by using an arithmetic coding algorithm, so as to obtain a code value interval. When a code value corresponding to the data exists in the code value interval, obtaining the code value according to the code value interval. The method further includes comparing a quantity of bits of the code value with a quantity of bits of the data, so as to obtain a comparison result, and performing a storage operation according to the comparison result.

20 Claims, 14 Drawing Sheets

(51) Int. Cl.
*G06F 3/06* (2006.01)
*G06F 7/08* (2006.01)
*G06F 17/30* (2006.01)

(58) Field of Classification Search
USPC .......................................... 341/107, 51, 87
See application file for complete search history.

(56) References Cited

U.S. PATENT DOCUMENTS

| | | | |
|---|---|---|---|
| 6,100,824 A | 8/2000 | Macleod et al. | |
| 7,808,406 B2 * | 10/2010 | He | H04N 19/91 341/107 |
| 2007/0280353 A1 | 12/2007 | Arakawa et al. | |
| 2010/0329330 A1 | 12/2010 | Yagasaki et al. | |

FOREIGN PATENT DOCUMENTS

| | | |
|---|---|---|
| CN | 101031086 A | 9/2007 |
| CN | 101087417 A | 12/2007 |
| CN | 102799590 A | 11/2012 |
| CN | 104579360 A | 4/2015 |
| EP | 0793349 A2 | 9/1997 |
| WO | 2004034330 A1 | 4/2004 |

OTHER PUBLICATIONS

"Arithmetic Coding," Wikipedia, XP055435918. Retrieved from the Internet: URL:https://en.wikipedia.org/w/index.php?title=Arithmetic_codingandoldid=645307814, Feb. 2, 2014, 14 pages.

Beal, R. et al., "p-Suffix Sorting as Arithmetic Coding," Journal of Discrete Algorithms, 16, 2012, 19 pages.

Wei, L. et al., "The Compression Technology of Character Type Message Based on Adaptive Arithmetic Coding," Jiangsu University of Science and Technology, Science Technology and Engineering, vol. 13, No. 10, Apr. 2013.

Weni, Z. et al., "An Improved Arithmetic Coding-Decoding Method Based on Look-up," Journal of Fudan University (Natural Science), vol. 45, No. 1, Feb. 2006, 5 pages.

Zengshuo, S., "The Context-based Adaptive Binary Arithmetic Coding in H.264," 2007, 52 pages.

Said, A., "Introduction to Arithmetic Coding—Theory and Practice," Imaging Systems Laboratory, HP Laboratories, Palo Alto, HPL-2004-76, Apr. 21, 2004, 67 pages.

* cited by examiner

DATA PROCESSING METHOD AND DEVICE

CROSS-REFERENCE TO RELATED APPLICATIONS

This application is a continuation of International Application No. PCT/CN2016/070805, filed on Jan. 13, 2016, which claims priority to Chinese Patent Application No. 201510059809.6, filed on Feb. 4, 2015. The disclosures of the aforementioned applications are hereby incorporated by reference in their entireties.

TECHNICAL FIELD

The present invention relates to the field of data processing, and in particular, to a data processing method and device.

BACKGROUND

In recent years, arithmetic coding is another extremely practical lossless compression algorithm. A core idea of the arithmetic coding is that all encoded symbols that may appear in source data are mapped to an integer set, and a corresponding appearance probability is assigned to each encoded symbol (it is required that a sum of appearance probabilities of all characters is 1 herein). Each character occupies a half-open and half-closed consecutive interval in an interval [0, 1] according to the appearance probability of each character, an interval length value is a probability value, and intervals are mutually independent. A string that needs to be encoded is mapped into an integer sequence according to a mapping table. The source data is gradually converted, according to appearance probabilities of the encoded symbols in the source data that needs to be encoded, into a real number interval corresponding to the interval [0, 1]. A real number in the interval is used as a code value and is saved in a computer. An interval for performing encoding next time is an interval obtained by means of encoding previous time. Appearance probability ratios of all the symbols remain the same each time. During decoding, the binary code value is resaved to the corresponding integer sequence according to inverse conversion, and then the integer sequence is mapped to the original string. For example, for integer set space {0, 1, 2, 3}, appearance probability distribution is {0.2, 0.5, 0.2, 0.1}. In this case, corresponding to data whose input sequence is <210013>, encoding intervals are sequentially [0.7, 0.9], [0.74, 0.84], [0.74, 0.76], [0.74, 0.744], [0.7408, 0.7428], and [0.7426, 0.7428]. Finally, a code value interval corresponding to the data is [0.7426, 0.7428] (the encoding interval corresponding to the last character sequence), and a code value of the data is a value in [0.7426, 0.7428].

For to-be-encoded data, in existing arithmetic coding, data is directly compressed without considering whether there is a compression gain, and then a corresponding code value obtained after the arithmetic coding is saved. However, data storage space is increased in the prior art because a quantity of bits of a code value corresponding to some data is large.

SUMMARY

Embodiments of the present invention provide a data processing method and device, and the method can reduce data storage space.

According to a first aspect, a data processing method is provided, including encoding data by using an arithmetic coding algorithm, so as to obtain a code value interval; when a code value corresponding to the data exists in the code value interval, obtaining the code value according to the code value interval; comparing a quantity of bits of the code value with a quantity of bits of the data, so as to obtain a comparison result; and performing a storage operation according to the comparison result.

With reference to the first aspect, in a first possible implementation manner, the comparison result is that the quantity of bits of the code value is less than the quantity of bits of the data, and the performing a storage operation according to the comparison result includes: storing the code value according to the comparison result.

With reference to the first aspect, in a second possible implementation manner, the comparison result is that the quantity of bits of the code value is greater than or equal to the quantity of bits of the data, and the performing a storage operation according to the comparison result includes: storing the data according to the comparison result.

With reference to the first possible implementation manner, in a third possible implementation manner, the method further includes: performing an application operation of the data according to the code value, where the application operation includes at least one of an equivalent comparison, sorting, or a fuzzy search.

With reference to the third possible implementation manner, in a fourth possible implementation manner, the data is an identity ID type string, the application operation includes the equivalent comparison, and the performing an application operation of the data according to the code value includes: when the code value is equal to a to-be-compared code value, determining that the data and data corresponding to the to-be-compared code value are the same data.

With reference to the third possible implementation manner, in a fifth possible implementation manner, the data is an ID type string or a letter string of a field, the application operation includes sorting, and the performing an application operation of the data according to the code value includes: determining a location of the code value in a to-be-sorted code value according to the code value, where the location of the code value is used to represent a location of the data in data corresponding to the to-be-sorted code value.

With reference to the third possible implementation manner, in a sixth possible implementation manner, the application operation includes the fuzzy search, and the performing an application operation of the data according to the code value includes: determining, according to whether the code value falls within an encoding interval of a prefix string that needs to be fuzzily searched, whether the data includes the prefix string, and when the code value falls within the encoding interval of the prefix string that needs to be fuzzily searched, the data includes the prefix string, or when the code value falls outside the encoding interval of the prefix string that needs to be fuzzily searched, the data does not include the prefix string.

With reference to any one of the first aspect or the first to the sixth possible implementation manners, in a seventh possible implementation manner, the encoding data by using an arithmetic coding algorithm, so as to obtain a code value interval includes: encoding the data by using the arithmetic coding algorithm, so as to obtain an encoding interval; re-extending the encoding interval of the data, so as to obtain a re-extended encoding interval; and continuing to encode the data according to the re-extended encoding interval by using the arithmetic coding algorithm, so as to obtain the code value interval.

With reference to the seventh possible implementation manner, in an eighth possible implementation manner, the re-extending the encoding interval of the data, so as to obtain a re-extended encoding interval includes: when at least one of the following conditions is met, re-extending the encoding interval of the data, so as to obtain the re-extended encoding interval and record a location of a corresponding re-extended character: a quantity of encoded characters of the data reaches a character quantity threshold or a length of the encoding interval of the data is less than an interval threshold.

With reference to any one of the first aspect or the first to the eighth possible implementation manners, in a ninth possible implementation manner, when a code value corresponding to the data exists in the code value interval, before the obtaining the code value according to the code value interval, the method further includes: determining whether an appropriate code value corresponding to the data exists in the code value interval.

With reference to the ninth possible implementation manner, in a tenth possible implementation manner, the method further includes: storing the data when no appropriate code value corresponding to the data exists in the code value interval.

According to a second aspect, a data processing method is provided, including: encoding data by using an arithmetic coding algorithm, so as to obtain an encoding interval; re-extending the encoding interval of the data, so as to obtain a re-extended encoding interval; continuing to encode the data according to the re-extended encoding interval by using the arithmetic coding algorithm, so as to obtain a code value interval; obtaining the code value according to the code value interval; and storing the code value.

With reference to the second aspect, in a first possible implementation manner, the re-extending the encoding interval of the data, so as to obtain a re-extended encoding interval includes: when at least one of the following conditions is met, re-extending the encoding interval of the data, so as to obtain the re-extended encoding interval and record a location of a corresponding re-extended character: a quantity of encoded characters of the data reaches a character quantity threshold or a length of the encoding interval of the data is less than an interval threshold.

According to a third aspect, a data processing method is provided, including: obtaining a code value of data and a location of a re-extended character; decoding the code value of the data by using an arithmetic coding algorithm, so as to obtain a decoding interval; re-scaling the decoding interval of the data according to the location of the re-extended character, so as to obtain a re-scaled decoding interval; and continuing to decode the data according to the re-scaled decoding interval by using the arithmetic coding algorithm, so as to obtain the data.

With reference to the third aspect, in a first possible implementation manner, the re-scaling the decoding interval of the data according to the location of the re-extended character, so as to obtain a re-scaled decoding interval includes: determining a location of a re-scaled character according to the location of the re-extended character, where the location of the re-extended character is inverse to the location of the re-scaled character; and re-scaling the decoding interval of the data according to the location of the re-scaled character, so as to obtain the re-scaled decoding interval.

According to a fourth aspect, a data processing method is provided, including: encoding data by using an arithmetic coding algorithm, so as to obtain a code value interval; obtaining the code value according to the code value interval; storing the code value; and performing an application operation of the data according to the code value, where the application operation includes at least one of an equivalent comparison, sorting, or a fuzzy search.

With reference to the fourth aspect, in a first possible implementation manner, the data is an ID type string, the application operation includes the equivalent comparison, and the performing an application operation of the data according to the code value includes: when the code value is equal to a to-be-compared code value, determining that the data and data corresponding to the to-be-compared code value are the same data.

With reference to the fourth aspect, in a second possible implementation manner, the data is an ID type string or a letter string of a field, the application operation includes sorting, and the performing an application operation of the data according to the code value includes: determining a location of the code value in a to-be-sorted code value according to the code value, where the location of the code value is used to represent a location of the data in data corresponding to the to-be-sorted code value.

With reference to the fourth aspect, in a third possible implementation manner, the application operation includes the fuzzy search, and the performing an application operation of the data according to the code value includes: determining, according to whether the code value falls within an encoding interval of a prefix string that needs to be fuzzily searched, whether the data includes the prefix string; and when the code value falls within the encoding interval of the prefix string that needs to be fuzzily searched, the data includes the prefix string, or when the code value falls outside the encoding interval of the prefix string that needs to be fuzzily searched, the data does not include the prefix string.

According to a fifth aspect, a data processing device is provided, including: an encoding unit, configured to encode data by using an arithmetic coding algorithm, so as to obtain a code value interval; an obtaining unit, configured to obtain, when a code value corresponding to the data exists in the code value interval, the code value according to the code value interval; a comparison unit, configured to compare a quantity of bits of the code value with a quantity of bits of the data, so as to obtain a comparison result; and a first storage unit, configured to perform a storage operation according to the comparison result.

With reference to the fifth aspect, in a first possible implementation manner, the comparison result is that the quantity of bits of the code value is less than the quantity of bits of the data, and the first storage unit saves the code value according to the comparison result.

With reference to the fifth aspect, in a second possible implementation manner, the comparison result is that the quantity of bits of the code value is greater than or equal to the quantity of bits of the data, and the first storage unit saves the data according to the comparison result.

With reference to the first possible implementation manner of the fifth aspect, in a third possible implementation manner, the device further includes an application unit, configured to perform an application operation of the data according to the code value, where the application operation includes at least one of an equivalent comparison, sorting, or a fuzzy search.

With reference to the third possible implementation manner of the fifth aspect, in a fourth possible implementation manner, the data is an ID type string, the application operation includes the equivalent comparison, and when the code value is equal to a to-be-compared code value, the application unit determines that the data and data corresponding to the to-be-compared code value are the same data.

With reference to the third possible implementation manner of the fifth aspect, in a sixth possible implementation manner, the data is an ID type string or a letter string of a field, the application operation includes sorting, and the application unit determines a location of the code value in a to-be-sorted code value according to the code value, where the location of the code value is used to represent a location of the data in data corresponding to the to-be-sorted code value.

With reference to the third possible implementation manner of the fifth aspect, in an eighth possible implementation manner, the application operation includes the fuzzy search, and the application unit determines, according to whether the code value falls within an encoding interval of a prefix string that needs to be fuzzily searched, whether the data includes the prefix string; and when the code value falls within the encoding interval of the prefix string that needs to be fuzzily searched, the data includes the prefix string, or when the code value falls outside the encoding interval of the prefix string that needs to be fuzzily searched, the data does not include the prefix string.

With reference to any one of the fifth aspect or the first to the ninth possible implementation manners of the fifth aspect, in a tenth possible implementation manner, the encoding unit encodes the data by using the arithmetic coding algorithm, so as to obtain an encoding interval; re-extends the encoding interval of the data, so as to obtain a re-extended encoding interval; and continues to encode the data according to the re-extended encoding interval by using the arithmetic coding algorithm, so as to obtain the code value interval.

With reference to the tenth possible implementation manner of the fifth aspect, in an eleventh possible implementation manner, when at least one of the following conditions is met, the encoding unit re-extends the encoding interval of the data, so as to obtain the re-extended encoding interval and record a location of a corresponding re-extended character: a quantity of encoded characters of the data reaches a character quantity threshold or a length of the encoding interval of the data is less than an interval threshold.

With reference to any one of the fifth aspect or the first to the eleventh possible implementation manners of the fifth aspect, in a twelfth possible implementation manner, the device further includes a determining unit, configured to determine, before the obtaining unit obtains the code value, whether an appropriate code value corresponding to the data exists in the code value interval.

With reference to the twelfth possible implementation manner of the fifth aspect, in a thirteenth possible implementation manner, the device further includes a second storage unit, configured to save the data when no appropriate code value corresponding to the data exists in the code value interval.

According to a sixth aspect, a data processing device is provided, including: a first encoding unit, configured to encode data by using an arithmetic coding algorithm, so as to obtain an encoding interval; an extension unit, configured to re-extend the encoding interval of the data, so as to obtain a re-extended encoding interval; a second encoding unit, configured to continue to encode the data according to the re-extended encoding interval by using the arithmetic coding algorithm, so as to obtain a code value interval; an obtaining unit, configured to obtain a code value according to the code value interval; and a storage unit, configured to save the code value.

With reference to the sixth aspect, in a first possible implementation manner, when at least one of the following conditions is met, the extension unit re-extends the encoding interval of the data, so as to obtain the re-extended encoding interval and record a location of a corresponding re-extended character: a quantity of encoded characters of the data reaches a character quantity threshold or a length of the encoding interval of the data is less than an interval threshold.

According to a seventh aspect, a data processing device is provided, including a first obtaining unit, configured to obtain a code value of data and a location of a re-extended character, a first decoding unit, configured to decode the code value of the data by using an arithmetic coding algorithm, so as to obtain a decoding interval, a scaling unit, configured to re-scale the decoding interval of the data according to the location of the re-extended character, so as to obtain a re-scaled decoding interval, and a second decoding unit, configured to continue to decode the data according to the re-scaled decoding interval by using the arithmetic coding algorithm, so as to obtain the data.

With reference to the seventh aspect, in a first possible implementation manner, the scaling unit determines a location of a re-scaled character according to the location of the re-extended character, where the location of the re-extended character is inverse to the location of the re-scaled character; and re-scales the decoding interval of the data according to the location of the re-scaled character, so as to obtain the re-scaled decoding interval.

According to an eighth aspect, a data processing device is provided, including an encoding unit, configured to encode data by using an arithmetic coding algorithm, so as to obtain a code value interval, an obtaining unit, configured to obtain a code value according to the code value interval; a storage unit, configured to save the code value, and an application unit, configured to perform an application operation of the data according to the code value, where the application operation includes at least one of an equivalent comparison, sorting, or a fuzzy search.

With reference to the eighth aspect, in a first possible implementation manner, the data is an ID type string, the application operation includes the equivalent comparison, and when the code value is equal to a to-be-compared code value, the application unit determines that the data and data corresponding to the to-be-compared code value are the same data.

With reference to the eighth aspect, in a third possible implementation manner, the data is an ID type string or a letter string of a field, the application operation includes sorting, and the application unit determines a location of the code value in a to-be-sorted code value according to the code value, where the location of the code value is used to represent a location of the data in data corresponding to the to-be-sorted code value.

With reference to the eighth aspect, in a fifth possible implementation manner, the application operation includes the fuzzy search, and the application unit determines, according to whether the code value falls within an encoding interval of a prefix string that needs to be fuzzily searched, whether the data includes the prefix string; and when the code value falls within the encoding interval of the prefix string that needs to be fuzzily searched, the data includes the prefix string, or when the code value falls outside the encoding interval of the prefix string that needs to be fuzzily searched, the data does not include the prefix string.

Based on the foregoing technical solutions, in the embodiments of the present invention, data is encoded by using an arithmetic coding algorithm, so as to obtain a code value interval. When a code value corresponding to the data exists in the code value interval, the code value is obtained according to the code value interval; a quantity of bits of the code value is compared with a quantity of bits of the data, so as to obtain a comparison result; and a storage operation is performed according to the comparison result. In the embodiments of the present invention, data storage space can be reduced.

BRIEF DESCRIPTION OF THE DRAWINGS

To describe the technical solutions in the embodiments of the present invention more clearly, the following briefly describes the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

DETAILED DESCRIPTION OF ILLUSTRATIVE EMBODIMENTS

The following clearly describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present invention.

Figure 1:
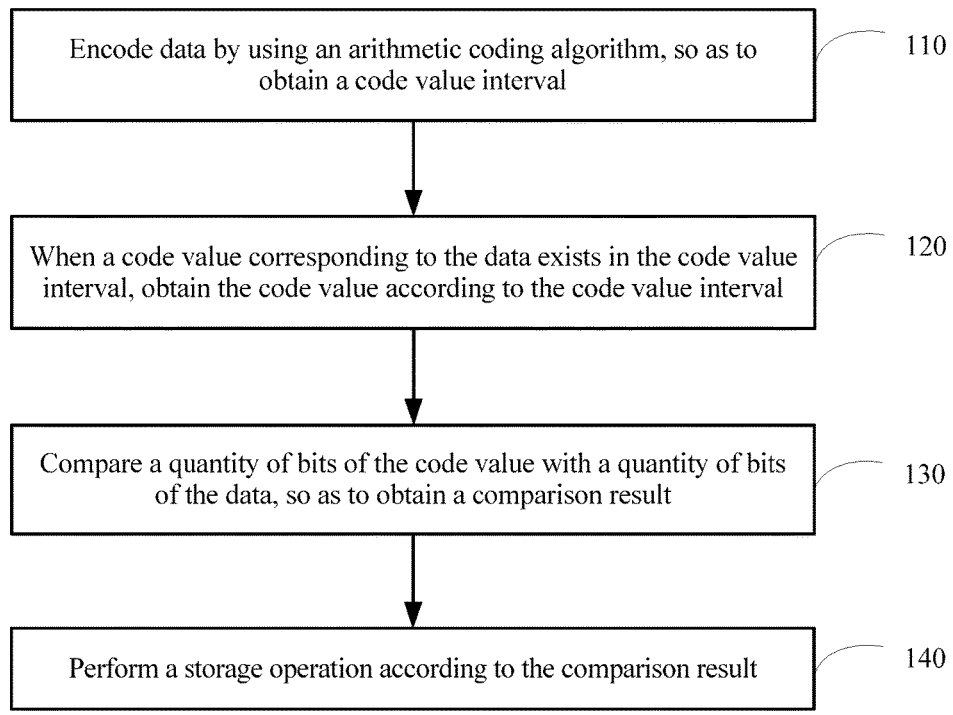
FIG. 1 is a schematic flowchart of a data compression method according to an embodiment of the present invention.

FIG. 1 is a schematic flowchart of a data compression method according to an embodiment of the present invention. The method in FIG. 1 may be executed by a data compression device in FIG. 4. The method in FIG. 1 includes the following steps.

110. Encode data by using an arithmetic coding algorithm, so as to obtain a code value interval.

Specifically, the code value interval may be an encoding interval corresponding to the last string of the data.

It should be understood that the data in this embodiment of the present invention may be an identity (Identity, ID) type string or a letter string of a field, or the like. The ID type string may include a data document number, an index number of a book, a bus license plate number, a product document number, an international mobile subscriber identification (International Mobile Subscriber Identification, IMSI) number, or an international mobile equipment identity (International Mobile Equipment Identity, IMEI), or the like. The letter string may include phonetic symbols corresponding to Chinese, Korean, or Japanese, or the like.

120. When a code value corresponding to the data exists in the code value interval, obtain the code value according to the code value interval.

In other words, when an appropriate code value may be obtained from the code value interval, the code value is obtained according to the code value interval. For example, the appropriate code value may be a code value that meets a particular quantity of bits, for example, a quantity of binary bits of the code value does not exceed 16 bits, 32 bits, or 64 bits.

It should be noted that the code value may be obtained according to the code value interval and an existing method, or the code value may be obtained according to a preset condition. For example, the preset condition is that the quantity of the binary bits of the code value does not exceed 16 bits, 32 bits, 64 bits, or the like. The preset condition is not limited in this embodiment of the present invention.

130. Compare a quantity of bits of the code value with a quantity of bits of the data, so as to obtain a comparison result.

Specifically, the comparison result may include that the quantity of bits of the code value is less than the quantity of bits of the data, the quantity of bits of the code value is equal to the quantity of bits of the data, or the quantity of bits of the code value is greater than the quantity of bits of the data.

140. Perform a storage operation according to the comparison result.

Specifically, data is encoded by using an arithmetic coding algorithm, so as to obtain a code value interval, then it is determined whether an appropriate code value may be obtained from the code value interval (an encoding interval corresponding to the last string of the data), and if no appropriate code value may be obtained, the data is directly saved without using arithmetic coding. If an appropriate code value may be obtained, a quantity of bits of the code value is compared with a quantity of bits of the data (a compression gain is determined). Specifically, it is determined whether the quantity of bits of the appropriate code value is greater than or equal to the quantity of bits of the source data, and if the quantity of bits of the appropriate code value is greater than or equal to the quantity of bits of the source data, that is, there is no compression gain, arithmetic coding is abandoned and the data may be directly saved. If the quantity of bits of the appropriate code value is less than the quantity of bits of the source data, that is, there is a compression gain, the code value is saved.

Therefore, in this embodiment of the present invention, data is encoded by using an arithmetic coding algorithm, so as to obtain a code value interval. When a code value corresponding to the data exists in the code value interval, the code value is obtained according to the code value interval; a quantity of bits of the code value is compared with a quantity of bits of the data, so as to obtain a comparison result; and a storage operation is performed according to the comparison result. In this embodiment of the present invention, incorrect encoding can be reduced, and data storage space can be reduced.

Optionally, in another embodiment, the comparison result is that the quantity of bits of the code value is less than the quantity of bits of the data, and the code value is saved according to the comparison result in step 140.

Specifically, when the quantity of bits of the code value is less than the quantity of bits of the data, it indicates that a compression gain exists, and the code value is saved.

Alternatively, in another embodiment, the comparison result is that the quantity of bits of the code value is greater than or equal to the quantity of bits of the data, and the data is saved according to the comparison result in step 140.

Specifically, when the quantity of bits of the code value is greater than or equal to the quantity of bits of the data, it indicates that there is no compression gain, and the data is saved.

Optionally, in another embodiment, when the code value is saved, the method in this embodiment of the present invention further includes performing an application operation of the data according to the code value. The application operation includes at least one of an equivalent comparison, sorting, or a fuzzy search.

Specifically, data is encoded by using an arithmetic coding algorithm, so as to obtain a code value interval; when a code value corresponding to the data exists in the code value interval, the code value is obtained according to the code value interval; a quantity of bits of the code value is compared with a quantity of bits of the data, so as to obtain a comparison result; and the comparison result is that the quantity of bits of the code value is less than the quantity of bits of the data, the code value is saved, and at least one of an equivalent comparison, sorting, or a fuzzy search of the data is performed according to the code value. For example, the equivalent comparison of the data may be performed according to the code value, the sorting of the data may be performed according to the code value, or the fuzzy search may be performed on the data according to the code value. The following separately describes the foregoing application operations of the data that are performed according to the code value.

Specifically, in another embodiment, the data is an ID type string, the application operation includes the equivalent comparison, and the performing an application operation of the data according to the code value includes: performing the equivalent comparison of the data according to the code value.

Further, in the another embodiment, the performing the equivalent comparison of the data according to the code value includes: when the code value is equal to a to-be-compared code value, determining that the data and data corresponding to the to-be-compared code value are the same data.

It should be understood that the to-be-compared code value is a code value of to-be-compared data (the data corresponding to the to-be-compared code value). Specifically, performing an equivalent comparison of code values may be understood as performing data matching. For example, when code values of two pieces of data are equal, it may be determined that the two pieces of data corresponding to the two code values are the same data, that is, matching is successful. When the two code values are not equal, it may be determined that the two pieces of data corresponding to the two code values are different data, that is, matching is unsuccessful.

Alternatively, in another embodiment, the data is an ID type string or a letter string of a field, the application operation includes sorting, and the performing an application operation of the data according to the code value includes: performing the sorting of the data according to the code value.

Further, in the another embodiment, performing sorting of the data according to the code value includes: determining a location of the code value in a to-be-sorted code value according to the code value. The location of the code value is used to represent a location of the data in data corresponding to the to-be-sorted code value.

Specifically, for example, the performing sorting of the data may be understood as sorting multiple pieces of data. For example, there are five pieces of data, the five pieces of data are corresponding to five code values, and the five code values are sorted in ascending order. For example, when a current code value is the fourth code value in the five code values, a piece of data corresponding to the fourth code value is sorted in the fourth place in the five pieces of data.

In existing database implementation, a compression technology and a search operation are generally separately considered, that is, a data storage technology and a relevant search optimization technology are independently considered. An important function of a database is to save and record related information such as important description of things of interest and development of the things. Therefore, when the things are tediously described, a large amount of storage space is occupied, and in addition, search inconvenience is brought. When multiple search operations (for example, string comparison and string sorting) are performed on data in the prior art, lower search efficiency is caused because characters in a string need to be gradually compared. However, in this embodiment of the present invention, an arithmetic decoding process is not required, data comparison (matching) is directly performed according to code values corresponding to data and/or data sorting is performed according to the code values, and a search operation of data of a complex type is equivalent to a search of a code value, which is quicker and simpler.

For example, in an application scenario in which only digits or letters occur in data (in this case, probabilities are allocated to the digits or the letters), for example, the data is non-Latin letter text, for example, Chinese, Korean, and Japanese each have corresponding phonetic symbols. Corresponding text may be converted into a phonetic symbol representation manner of the corresponding text, that is, a string including only letters, and then the data is encoded by using an arithmetic coding algorithm, so as to obtain a code value interval; when a code value corresponding to the data exists in the code value interval, it is determined that a quantity of bits of the code value is less than a quantity of bits of the data; and the code value is saved. A field corresponding to the data is sorted according to the code value.

Figure 2:
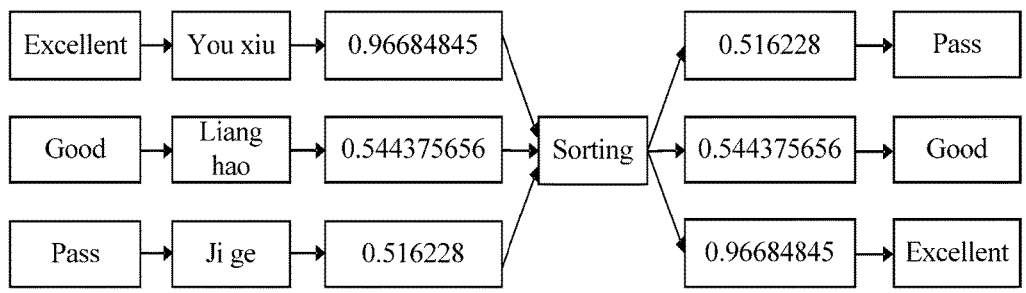
FIG. 2 is a schematic diagram of field sorting according to an embodiment of the present invention.

For example, distribution of appearance probabilities of Chinese phonetic letters (all Chinese phonetic letters) is A (0.107), B (0.014), C (0.017), D (0.030), E (0.062), F (0.009), G (0.060), H (0.067), I (0.141), J (0.023), K (0.008), L (0.017), M (0.014), N (0.117), 0 (0.065), P (0.008), Q (0.013), R (0.006), S (0.026), T (0.015), U (0.096), V (0.001), W (0.010), X (0.020), Y (0.028), and Z (0.026). As shown in FIG. 2, fields "excellent" (you xiu in Chinese Pinyin), "good" (liang hao in Chinese Pinyin), and "pass" (ji ge in Chinese Pinyin) are sorted according to a letter sequence and are encoded. A letter string corresponding to "excellent" is "you xiu", and a code value corresponding to "excellent" is 0.96684845. A letter string corresponding to "good" is "liang hao", and a code value corresponding to "good" is 0.544375656. A letter string corresponding to "pass" is "ji ge", and a code value corresponding to "pass" is 0.516228. Sequential sorting of the code values in ascending order is 0.516228, 0.544375656, and 0.96684845, and 0.516228, 0.544375656, and 0.96684845 are corresponding to "pass", "good", and "excellent" respectively.

Alternatively, in another embodiment, the application operation includes the fuzzy search, and the performing an application operation of the data according to the code value includes: performing the fuzzy search on the data according to the code value.

Further, in the another embodiment, the performing the fuzzy search on the data according to the code value includes: determining, according to whether the code value falls within an encoding interval of a prefix string that needs to be fuzzily searched, whether the data includes the prefix string. When the code value falls within the encoding interval of the prefix string that needs to be fuzzily searched, the data includes the prefix string, or when the code value falls outside the encoding interval of the prefix string that needs to be fuzzily searched, the data does not include the prefix string.

In other words, when the code value falls within the encoding interval of the prefix string that needs to be fuzzily searched, the data meets the fuzzy search, or when the code value falls outside the encoding interval of the prefix string that needs to be fuzzily searched, the data does not meet the fuzzy search.

Figure 3:
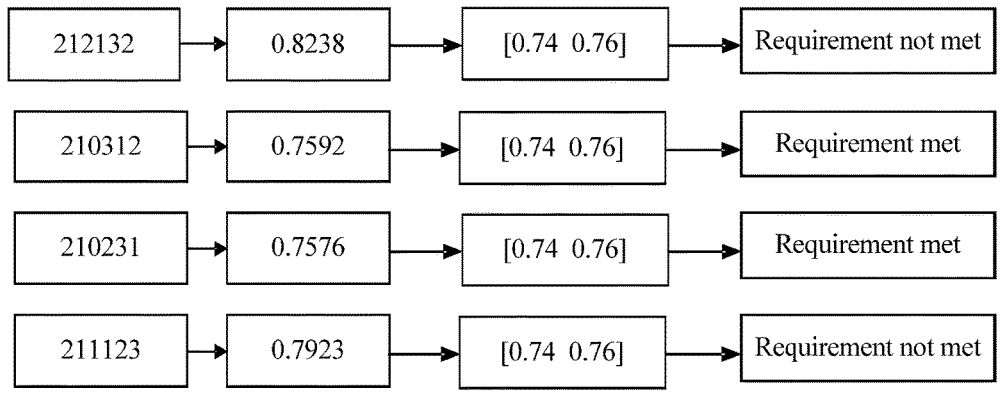
FIG. 3 is a schematic diagram of a fuzzy search according to an embodiment of the present invention.

Specifically, when a string is compressed by using arithmetic coding, a series of code values is obtained. The code values come from encoding intervals obtained after the string is encoded, and the encoding intervals are not mutually orthogonal. It is further noted that the encoding intervals of the string are always included in encoding intervals of a prefix string of the string. For example, encoding intervals of a string "A12986572" are definitely included in encoding intervals of a prefix string such as "A1298" or "A12". A fuzzy search may be performed provided that whether the code values fall within an encoding interval of a prefix string that needs to be fuzzily searched is determined. For example, for integer set space {0, 1, 2, 3}, appearance probability distribution is {0.2, 0.5, 0.2, 0.1}. For a fuzzy search %210xxx, the fuzzy search is performed on data 212132, 210312, 210231, and 211123. As shown in FIG. 3, a code value interval of "210" is [0.74, 0.76], and code value intervals corresponding to 212132, 210312, 210231, and 211123 are 0.8238, 0.7592, 0.7576, and 0.7923. Because 0.7592 and 0.7576 fall within an encoding interval [0.74, 0.76] of the prefix string that needs to be fuzzily searched, and 0.8238 and 0.7923 fall outside the encoding interval [0.74, 0.76] of the prefix string that needs to be fuzzily searched, 210312 and 210231 meet the fuzzy search, and 212132 and 211123 do not meet the fuzzy search.

Therefore, in this embodiment of the present invention, in addition, in a fuzzy search operation, when a quantity of index characters is greater than 2, an operation required for determining an interval location may be skipped.

Optionally, in another embodiment, in step 110, the data is encoded by using the arithmetic coding algorithm, so as to obtain an encoding interval; the encoding interval of the data is re-extended, so as to obtain a re-extended encoding interval and record a location of a corresponding re-extended character; and the data continues to be encoded according to the re-extended encoding interval by using the arithmetic coding algorithm, so as to obtain the code value interval. The location of the corresponding re-extended character is recorded, so that a decoding device obtains a location of a re-scaled character according to the code value and the location of the re-extended character, performs decoding interval re-scaling according to the location of the re-scaled character, and obtains the data.

Specifically, in this embodiment of the present invention, an encoding interval corresponding to any character may be re-extended, or encoding interval re-extension may be performed according to a preset condition.

Therefore, in this embodiment of the present invention, encoding interval re-extension may be performed on an encoding interval of data. Because the encoding interval is re-extended, a code value interval is accordingly expanded. Therefore, in this embodiment of the present invention, an appropriate code value can be obtained more easily from an expanded code value interval, which avoids incorrect encoding, and implements correct encoding. In addition, in this embodiment of the present invention, performing the interval re-extension can use space with a limited quantity of bits to represent sufficiently long string data.

Further, in the another embodiment, in step 110, when at least one of the following conditions is met, the encoding interval of the data is re-extended, so as to obtain the re-extended encoding interval: a quantity of encoded characters of the data reaches a character quantity threshold or a length of the encoding interval of the data is less than an interval threshold.

Specifically, when that a quantity of characters of the data is greater than the preset character quantity threshold is met, in step 110, the data is encoded by using the arithmetic coding algorithm, or when the quantity of encoded characters of the data reaches the preset character quantity threshold, an encoding interval of a character of the data corresponding to the preset character quantity threshold is re-extended and the location of the corresponding re-extended character is recorded, and the data continues to be encoded according to the re-extended encoding interval by using the arithmetic coding algorithm, so as to obtain the code value interval.

In other words, when a string of the data is gradually encoded by using the arithmetic coding algorithm, when the quantity of encoded characters of the data reaches the preset character quantity threshold, the encoding interval of the character of the data corresponding to the preset character quantity threshold is re-extended, and the location of the corresponding re-extended character is recorded, and the data continues to be encoded according to the re-extended encoding interval by using the arithmetic coding algorithm, so as to obtain the code value interval.

For example, current data includes a string including 12 characters, and a preset character quantity threshold is 10. When the 12 strings of the current data are encoded by using an arithmetic coding algorithm, an encoding interval of the tenth character in the 12 strings is re-extended, and it is recorded that a location of a re-extended character is a location of the tenth character. Then, the data (the eleventh and the twelfth characters) continues to be encoded according to a re-extended encoding interval by using the arithmetic coding algorithm, and finally a code value interval (an encoding interval corresponding to the twelfth character) is obtained.

With an increase of a length of a string of data, a length of an encoding interval obtained by means of encoding is increasingly shorter, and it is difficult to obtain an appropriate code value from a shorter encoding interval length. Therefore, to avoid, as much as possible, possible occurrence of a problem that arithmetic coding cannot be correctly performed, in this embodiment of the present invention, encoding interval re-extension is performed when a quantity of characters reaches a preset character quantity threshold. Because an encoding interval is re-extended, a code value interval is accordingly expanded. Therefore, in this embodiment of the present invention, an appropriate code value can be obtained more easily from an expanded code value interval, which avoids incorrect encoding, and implements correct encoding. In addition, in this embodiment of the present invention, performing the interval re-extension can use space with a limited quantity of bits to represent sufficiently long string data.

When that the length of the encoding interval of the data is less than the preset threshold is met, in step 110, the encoding interval of the data is re-extended; and the data continues to be encoded according to the re-extended encoding interval by using the arithmetic coding algorithm, so as to obtain the code value interval.

In other words, when a string of the data is gradually encoded by using the arithmetic coding algorithm, an encoding interval is increasingly smaller. When the encoding interval is less than the preset threshold, the encoding interval less than the preset threshold is re-extended, and then a to-be-encoded string in the data continues to be encoded according to the re-extended encoding interval by using the arithmetic coding algorithm, and finally, the code value interval is obtained.

For example, current data includes a string including 12 characters, and a preset threshold is 0.05. When the 12 strings of the current data are encoded by using an arithmetic coding algorithm and when an encoding interval is less than 0.05, the encoding interval of the data is re-extended. For example, when an encoding interval of the seventh character is 0.1, and an encoding interval of the eighth character is 0.04, the encoding interval 0.04 of the eighth character is re-extended, for example, 0.04 is extended to 1, 10, or the like. The data (the ninth to twelfth characters) continues to be encoded according to a re-extended encoding interval (1 or 10) by using the arithmetic coding algorithm, so as to obtain a code value interval (an encoding interval corresponding to the twelfth character).

With an increase of a length of a string of data, a length of an encoding interval obtained by means of encoding is increasingly shorter, and it is difficult to obtain an appropriate code value from a shorter encoding interval length. Therefore, to avoid, as much as possible, possible occurrence of a problem that arithmetic coding cannot be correctly performed, in this embodiment of the present invention, encoding interval re-extension is performed. Because an encoding interval is re-extended, a code value interval is accordingly expanded. Therefore, in this embodiment of the present invention, an appropriate code value can be obtained more easily from an expanded code value interval, which avoids incorrect encoding, and implements correct encoding. In addition, in this embodiment of the present invention, performing the interval re-extension can use space with a limited quantity of bits to represent sufficiently long string data.

It should be noted that all information for performing the interval extension is also sent to a decoder, that is, when transferring a binary code value to the decoder, an encoder also sends shift mechanism information to the decoder, so as to synchronize information and ensure that a correct decoding result is obtained during decoding.

Figure 4:
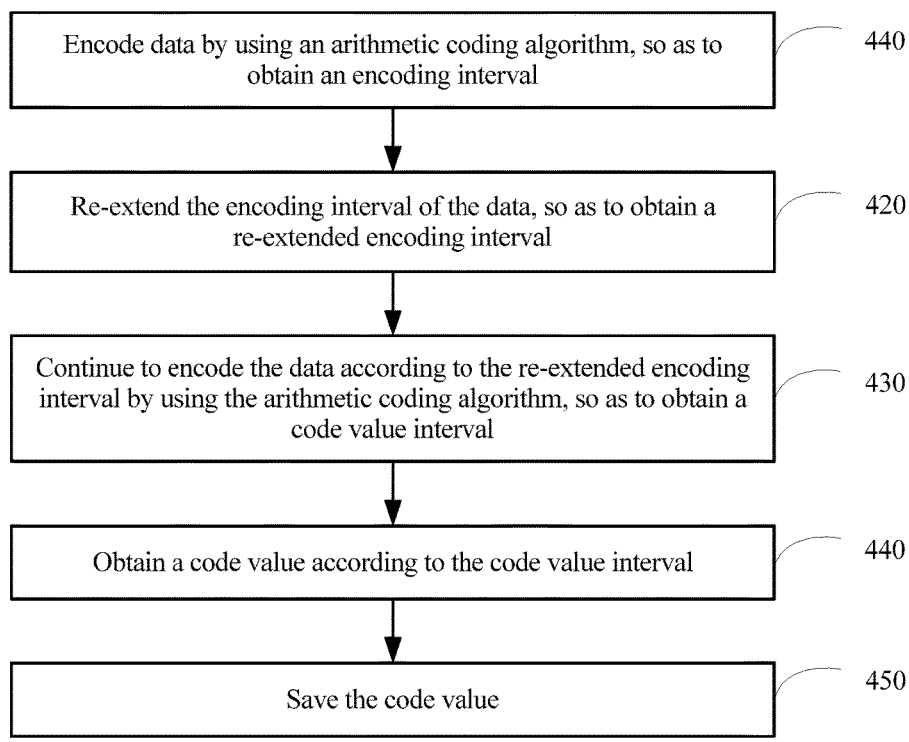
FIG. 4 is a schematic flowchart of a data processing method according to another embodiment of the present invention.

FIG. 4 is a schematic flowchart of a data processing method according to another embodiment of the present invention. The method in FIG. 4 may be executed by a data processing device, and specifically, may be executed by an encoding device. As shown in FIG. 4, the method includes the following steps.

410. Encode data by using an arithmetic coding algorithm, so as to obtain an encoding interval.

420. Re-extend the encoding interval of the data, so as to obtain a re-extended encoding interval.

Specifically, in this embodiment of the present invention, an encoding interval corresponding to any character may be re-extended, or encoding interval re-extension may be performed according to a preset condition.

430. Continue to encode the data according to the re-extended encoding interval by using the arithmetic coding algorithm, so as to obtain a code value interval.

440. Obtain a code value according to the code value interval.

450. Save the code value.

Therefore, in this embodiment of the present invention, encoding interval re-extension is performed on an encoding interval of data. Because the encoding interval is re-extended, a code value interval is accordingly expanded. Therefore, in this embodiment of the present invention, an appropriate code value can be obtained more easily from an expanded code value interval, which avoids incorrect encoding, and implements correct encoding. In addition, in this embodiment of the present invention, performing the interval re-extension can use space with a limited quantity of bits to represent sufficiently long string data.

Further, in another embodiment, in step 420, when at least one of the following conditions is met, the encoding interval of the data is re-extended, so as to obtain the re-extended encoding interval and record a location of a corresponding re-extended character: a quantity of encoded characters of the data reaches a character quantity threshold or a length of the encoding interval of the data is less than an interval threshold. The location of the corresponding re-extended character is recorded, so that a decoding device obtains a location of a re-scaled character according to the code value and the location of the re-extended character, performs decoding interval re-scaling according to the location of the re-scaled character, and obtains the data.

Specifically, when that a quantity of characters of the data is greater than the preset character quantity threshold is met, the data is encoded by using the arithmetic coding algorithm, or when the quantity of encoded characters of the data reaches the preset character quantity threshold, an encoding interval of a character of the data corresponding to the preset character quantity threshold is re-extended, and the data continues to be encoded according to the re-extended encoding interval by using the arithmetic coding algorithm, so as to obtain the code value interval.

In other words, when a string of the data is gradually encoded by using the arithmetic coding algorithm, when the quantity of encoded characters of the data reaches the preset character quantity threshold, the encoding interval of the character of the data corresponding to the preset character quantity threshold is re-extended, and the data continues to be encoded according to the re-extended encoding interval by using the arithmetic coding algorithm, so as to obtain the code value interval.

For example, current data includes a string including 12 characters, and a preset character quantity threshold is 10. When the 12 strings of the current data are encoded by using an arithmetic coding algorithm, an encoding interval of the tenth character in the 12 strings is re-extended, and it is recorded that a location of a re-extended character is a location of the tenth character. Then, the data (the eleventh and the twelfth characters) continues to be encoded according to a re-extended encoding interval by using the arithmetic coding algorithm, and finally a code value interval (an encoding interval corresponding to the twelfth character) is obtained.

With an increase of a length of a string of data, a length of an encoding interval obtained by means of encoding is increasingly shorter, and it is difficult to obtain an appropriate code value from a shorter encoding interval length. Therefore, to avoid, as much as possible, possible occurrence of a problem that arithmetic coding cannot be correctly performed, in this embodiment of the present invention, encoding interval re-extension is performed when a quantity of characters reaches a preset character quantity threshold. Because an encoding interval is re-extended, a code value interval is accordingly expanded. Therefore, in this embodiment of the present invention, an appropriate code value can be obtained more easily from an expanded code value interval, which avoids incorrect encoding, and implements correct encoding. In addition, in this embodiment of the present invention, performing the interval re-extension can use space with a limited quantity of bits to represent sufficiently long string data.

When that the length of the encoding interval of the data is less than the preset threshold is met, the encoding interval of the data is re-extended; and the data continues to be encoded according to the re-extended encoding interval by using the arithmetic coding algorithm, so as to obtain the code value interval.

In other words, when a string of the data is gradually encoded by using the arithmetic coding algorithm, an encoding interval is increasingly smaller. When the encoding interval is less than the preset threshold, the encoding interval less than the preset threshold is re-extended, and then a to-be-encoded string in the data continues to be encoded according to the re-extended encoding interval by using the arithmetic coding algorithm, and finally, the code value interval is obtained.

For example, current data includes a string including 12 characters, and a preset threshold is 0.05. When the 12 strings of the current data are encoded by using an arithmetic coding algorithm and when an encoding interval is less than 0.05, the encoding interval of the data is re-extended. For example, when an encoding interval of the seventh character is 0.1, and an encoding interval of the eighth character is 0.04, the encoding interval 0.04 of the eighth character is re-extended, for example, 0.04 is extended to 1, 10, or the like. The data (the ninth to twelfth characters) continues to be encoded according to a re-extended encoding interval (1 or 10) by using the arithmetic coding algorithm, so as to obtain a code value interval (an encoding interval corresponding to the twelfth character).

With an increase of a length of a string of data, a length of an encoding interval obtained by means of encoding is increasingly shorter, and it is difficult to obtain an appropriate code value from a shorter encoding interval length. Therefore, to avoid, as much as possible, possible occurrence of a problem that arithmetic coding cannot be correctly performed, in this embodiment of the present invention, encoding interval re-extension is performed. Because an encoding interval is re-extended, a code value interval is accordingly expanded. Therefore, in this embodiment of the present invention, an appropriate code value can be obtained more easily from an expanded code value interval, which avoids incorrect encoding, and implements correct encoding. In addition, in this embodiment of the present invention, performing the interval re-extension can use space with a limited quantity of bits to represent sufficiently long string data.

It should be noted that all information for performing the interval extension is also sent to a decoder, that is, when transferring a binary code value to the decoder, an encoder also sends shift mechanism information to the decoder, so as to synchronize information and ensure that a correct decoding result is obtained during decoding.

Figure 5:
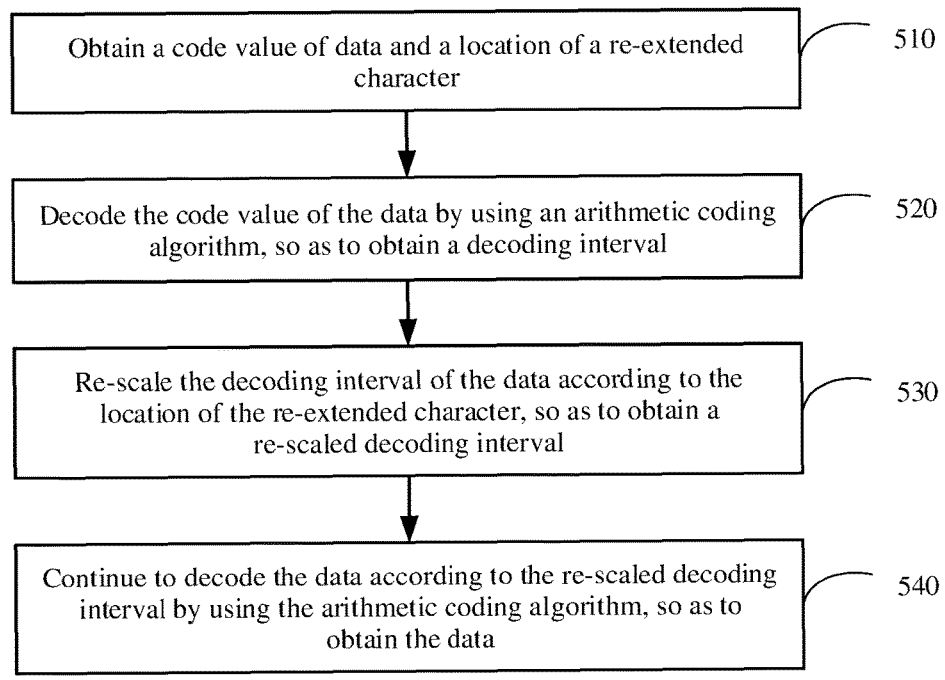
FIG. 5 is a schematic flowchart of a data processing method according to another embodiment of the present invention.

FIG. 5 is a schematic flowchart of a data processing method according to another embodiment of the present invention. The method in FIG. 5 may be executed by a data processing device, and specifically, may be executed by a decoding device. As shown in FIG. 5, the method includes the following steps.

510. Obtain a code value of data and a location of a re-extended character.

520. Decode the code value of the data by using an arithmetic coding algorithm, so as to obtain a decoding interval.

530. Re-scale the decoding interval of the data according to the location of the re-extended character, so as to obtain a re-scaled decoding interval.

540. Continue to decode the data according to the re-scaled decoding interval by using the arithmetic coding algorithm, so as to obtain the data.

Therefore, in this embodiment of the present invention, decoding interval re-scaling is performed according to a code value in a re-extended encoding interval, which avoids incorrect decoding, and implements correct decoding.

Specifically, in another embodiment, in step 530, a location of a re-scaled character is determined according to the location of the re-extended character, where the location of the re-extended character is inverse to the location of the re-scaled character; and the decoding interval of the data is re-scaled according to the location of the re-scaled character, so as to obtain the re-scaled decoding interval: a quantity of encoded characters of the data reaches a character quantity threshold and a length of an encoding interval of the data is less than an interval threshold.

It should be understood that the location of the re-extended character is inverse to the location of the re-scaled character, in other words, the location of the re-extended character is opposite to (or symmetric with) the location of the re-scaled character. For example, current data includes a string including 12 characters, an encoding interval of the tenth character in the 12 strings is re-extended, a location of a re-extended character is a location of the tenth character, and it may be determined that a location of a re-scaled character is a location of the third character according to the location of the tenth characters.

It should be understood that the data processing method in FIG. 5 is corresponding to the data processing method in FIG. 4, and a difference lies in that a decoding process in FIG. 5 is an inverse operation of an encoding process in FIG. 4. The method in FIG. 5 may be obtained by using an inverse process of the process in FIG. 4. To avoid repetition, details are not described herein.

Figure 6:
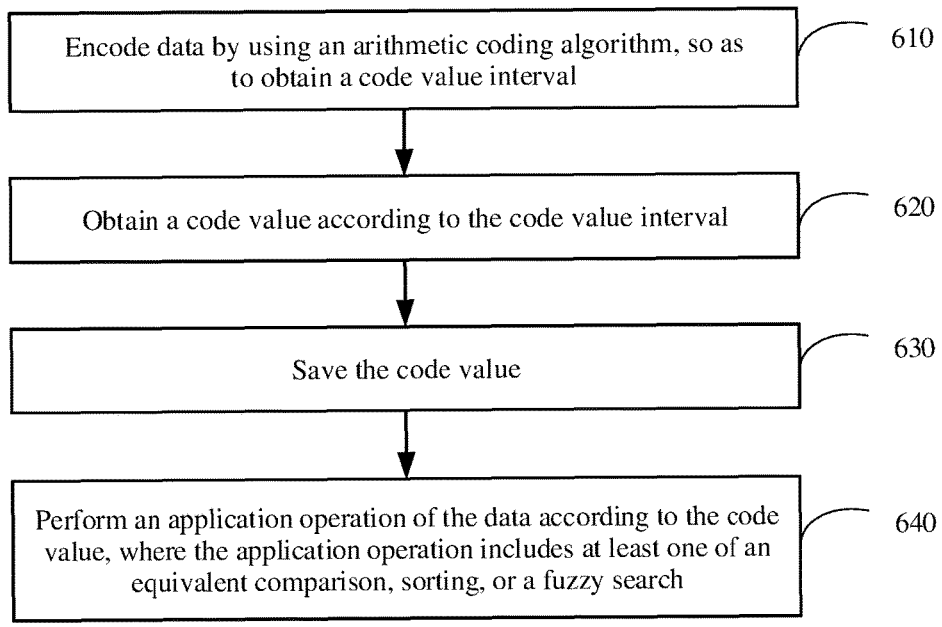
FIG. 6 is a schematic flowchart of a data processing method according to another embodiment of the present invention.

FIG. 6 is a schematic flowchart of a data processing method according to another embodiment of the present invention. The method in FIG. 6 may be executed by a data processing device. As shown in FIG. 6, the method includes the following steps.

610. Encode data by using an arithmetic coding algorithm, so as to obtain a code value interval.

620. Obtain a code value according to the code value interval.

630. Save the code value.

640. Perform an application operation of the data according to the code value, where the application operation includes at least one of an equivalent comparison, sorting, or a fuzzy search.

Therefore, in this embodiment of the present invention, a code value is obtained by means of data encoding, at least one application of an equivalent comparison, sorting, or a fuzzy search of data is performed according to the code value, which is different from the prior art that an equivalent comparison, sorting, and a fuzzy search of data are performed according to the source data, and an application of the original complex data is equivalent to corresponding processing performed by using the code value, which is quicker and simpler.

Optionally, in another embodiment, the data is an ID type string, the application operation includes the equivalent comparison, and in step 640, the equivalent comparison of the data is performed according to the code value.

Further, in the another embodiment, in step 640, when the code value is equal to a to-be-compared code value, it is determined that the data and data corresponding to the to-be-compared code value are the same data.

Specifically, performing an equivalent comparison of code values may be understood as performing data matching. For example, when two code values are equal, it may be determined that pieces of data corresponding to the two code values are the same data, that is, matching is successful. When the two code values are not equal, it may be determined that the pieces of data corresponding to the two code values are different data, that is, matching is unsuccessful.

Alternatively, in another embodiment, the data is an ID type string or a letter string of a field, the application operation includes sorting, and in step 640, the sorting of the data is performed according to the code value.

Further, in the another embodiment, in step 640, a location of the code value in a to-be-sorted code value is determined according to the code value. The location of the code value is used to represent a location of the data in data corresponding to the to-be-sorted code value.

Specifically, for example, performing sorting of the data may be understood as sorting multiple pieces of data. For example, there are five pieces of data, the five pieces of data are corresponding to five code values, and the five code values are sorted in ascending order. For example, when a current code value is the fourth code value in the five code values, a piece of data corresponding to the fourth code value is sorted in the fourth place in the five pieces of data.

In existing database implementation, a compression technology and a search operation are generally separately considered, that is, a data storage technology and a relevant search optimization technology are independently considered. An important function of a database is to save and record related information such as important description of things of interest and development of the things. Therefore, when the things are tediously described, a large amount of storage space is occupied, and in addition, search inconvenience is brought. When multiple search operations (for example, string comparison and string sorting) are performed on data in the prior art, lower search efficiency is caused because characters in a string need to be gradually compared. However, in this embodiment of the present invention, an arithmetic decoding process is not required, data comparison (matching) is directly performed according to code values corresponding to data and/or data sorting is performed according to the code values, and a search operation of data of a complex type is equivalent to a search of a code value, which is quicker and simpler.

For example, in an application scenario in which only digits or letters occur in data (in this case, probabilities are allocated to the digits or the letters), for example, the data is non-Latin letter text, for example, Chinese, Korean, and Japanese each have corresponding phonetic symbols. Corresponding text may be converted into a phonetic symbol representation manner of the corresponding text, that is, a string including only letters, and then the data is encoded by using an arithmetic coding algorithm, so as to obtain a code value interval; when a code value corresponding to the data exists in the code value interval, it is determined that a quantity of bits of the code value is less than a quantity of bits of the data; and the code value is saved. A field corresponding to the data is sorted according to the code value.

For example, distribution of appearance probabilities of Chinese phonetic letters (all Chinese phonetic letters) is A (0.107), B (0.014), C (0.017), D (0.030), E (0.062), F (0.009), G (0.060), H (0.067), I (0.141), J (0.023), K (0.008), L (0.017), M (0.014), N (0.117), O (0.065), P (0.008), Q (0.013), R (0.006), S (0.026), T (0.015), U (0.096), V (0.001), W (0.010), X (0.020), Y (0.028), and Z (0.026). As shown in FIG. 2, fields "excellent", "good", and "pass" are sorted according to a letter sequence and are encoded. A letter string corresponding to "excellent" is "you xiu", and a code value corresponding to "excellent" is 0.96684845. A letter string corresponding to "good" is "liang hao", and a code value corresponding to "good" is 0.544375656. A letter string corresponding to "pass" is "ji ge", and a code value corresponding to "pass" is 0.516228. Sequential sorting of the code values in ascending order is 0.516228, 0.544375656, and 0.96684845, and 0.516228, 0.544375656, and 0.96684845 are corresponding to "pass", "good", and "excellent" respectively.

Alternatively, in another embodiment, the application operation includes the fuzzy search, and in step 640, the fuzzy search is performed on the data according to the code value.

Further, in the another embodiment, in step 640, it is determined, according to whether the code value falls within an encoding interval of a prefix string that needs to be fuzzily searched, whether the data includes the prefix string. When the code value falls within the encoding interval of the prefix string that needs to be fuzzily searched, the data includes the prefix string, or when the code value falls outside the encoding interval of the prefix string that needs to be fuzzily searched, the data does not include the prefix string.

In other words, when the code value falls within the encoding interval of the prefix string that needs to be fuzzily searched, the data meets the fuzzy search, or when the code value falls outside the encoding interval of the prefix string that needs to be fuzzily searched, the data does not meet the fuzzy search.

Specifically, when a string is compressed by using arithmetic coding, a series of code values is obtained. The code values come from encoding intervals obtained after the string is encoded, and the encoding intervals are not mutually orthogonal. It is further noted that the encoding intervals of the string are always included in encoding intervals of a prefix string of the string. For example, encoding intervals of a string "A12986572" are definitely included in encoding intervals of a prefix string such as "A1298" or "A12". A fuzzy search may be performed provided that whether the code values fall within an encoding interval of a prefix string that needs to be fuzzily searched is determined. For example, for integer set space {0, 1, 2, 3}, appearance probability distribution is {0.2, 0.5, 0.2, 0.1}. For a fuzzy search %210xxx, the fuzzy search is performed on data 212132, 210312, 210231, and 211123. As shown in FIG. 3, a code value interval of "210" is [0.74, 0.76], and code value intervals corresponding to 212132, 210312, 210231, and 211123 are 0.8238, 0.7592, 0.7576, and 0.7923. Because 0.7592 and 0.7576 fall within an encoding interval [0.74, 0.76] of the prefix string that needs to be fuzzily searched, and 0.8238 and 0.7923 fall outside the encoding interval [0.74, 0.76] of the prefix string that needs to be fuzzily searched, 210312 and 210231 meet the fuzzy search, and 212132 and 211123 do not meet the fuzzy search.

Therefore, in this embodiment of the present invention, in addition, in a fuzzy search operation, when a quantity of index characters is greater than 2, an operation required for determining an interval location may be skipped.

The foregoing describes the data processing method in the embodiments of the present invention in detail with reference to FIG. 1 to FIG. 6. The following describes the embodiments of the present invention in more detail with reference to specific examples in FIG. 7 to FIG. 11. It should be noted that the examples in FIG. 7 to FIG. 11 are merely intended to help a person skilled in the art understand the embodiments of the present invention instead of limiting the embodiments of the present invention to a specific value or a specific scenario shown in the examples. A person skilled in the art certainly can make various equivalent modifications or changes according to the examples provided in FIG. 7 to FIG. 11, and such modifications or changes also fall within the scope of the embodiments of the present invention.

Figure 7:
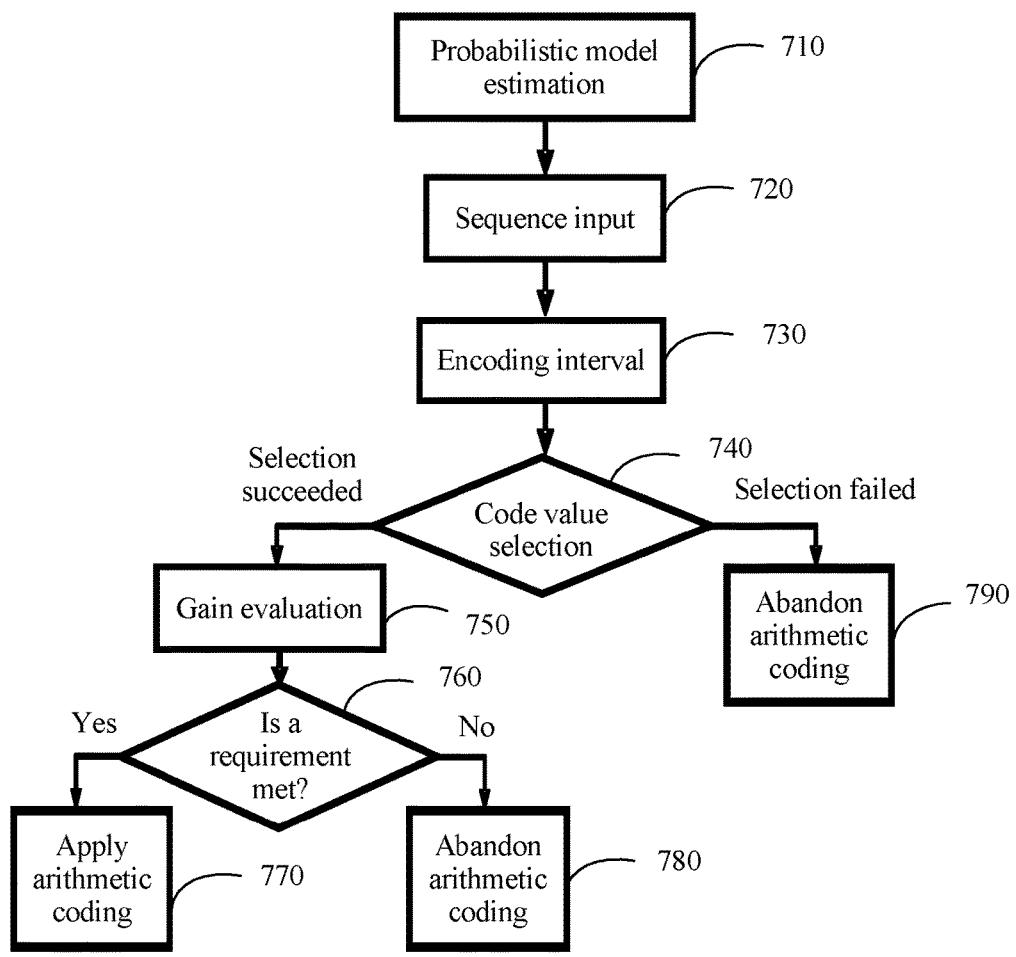
FIG. 7 is a schematic flowchart of a data processing method according to another embodiment of the present invention.

FIG. 7 is a schematic flowchart of a data processing method according to another embodiment of the present invention. The method in FIG. 7 displays a process in which whether arithmetic coding is used is evaluated according to a gain. The method in FIG. 7 includes the following steps.

710. Probabilistic model estimation.

720. Sequence input.

Specifically, the sequence may be a string sequence of source data, for example, may be a data type combining digits and letters, or may be a data type with only digits or only letters, for example, the inputted sequence may be a data document number, an index number of a book, a bus license plate number, a product document number, an IMSI, or an IMEI, or phonetic symbols corresponding to Chinese, Korean, or Japanese, or the like.

730. Encoding interval.

Specifically, the encoding interval of the source data is determined according to an arithmetic coding algorithm.

740. Code value selection.

Specifically, it is determined whether a code value corresponding to the data exists in the encoding interval. In other words, it is determined whether a code value may be selected. If a code value may be selected, step 750 is performed. If no code value may be selected, step 790 is performed.

750. Gain evaluation.

Specifically, when a code value corresponding to the data exists in a code value interval, it is determined whether a quantity of bits of the code value meets a requirement, for example, it is determined whether the quantity of bits of the code value is less than a quantity of bits of the data.

760. Is a requirement met?

When the requirement is met, step 770 is performed. Otherwise, when the requirement is not met, step 780 is performed.

770. Apply arithmetic coding.

Specifically, operations such as an equivalent comparison, sorting, and a fuzzy search may be performed according to the code value.

780. Abandon arithmetic coding.

Specifically, arithmetic coding is abandoned.

790. Abandon arithmetic coding.

Specifically, arithmetic coding is abandoned.

Specifically, in this embodiment of the present invention, it may be determined whether an appropriate code value can be obtained from encoding interval obtained last time. If no appropriate code value can be obtained, the data is directly saved without using the arithmetic coding. When an appropriate code value may be obtained, it is determined whether a required quantity of bits used to represent the code value is greater than a required quantity of bits used to represent the source data. If there is no compression gain, use of the arithmetic coding is abandoned.

Therefore, in this embodiment of the present invention, data is encoded by using an arithmetic coding algorithm, so as to obtain a code value interval; when a code value corresponding to the data exists in the code value interval, it is determined that a quantity of bits of the code value is less than a quantity of bits of the data, and the code value is saved. In this embodiment of the present invention, a gain is determined, which can reduce incorrect encoding, and reduce data storage space.

Figure 8:
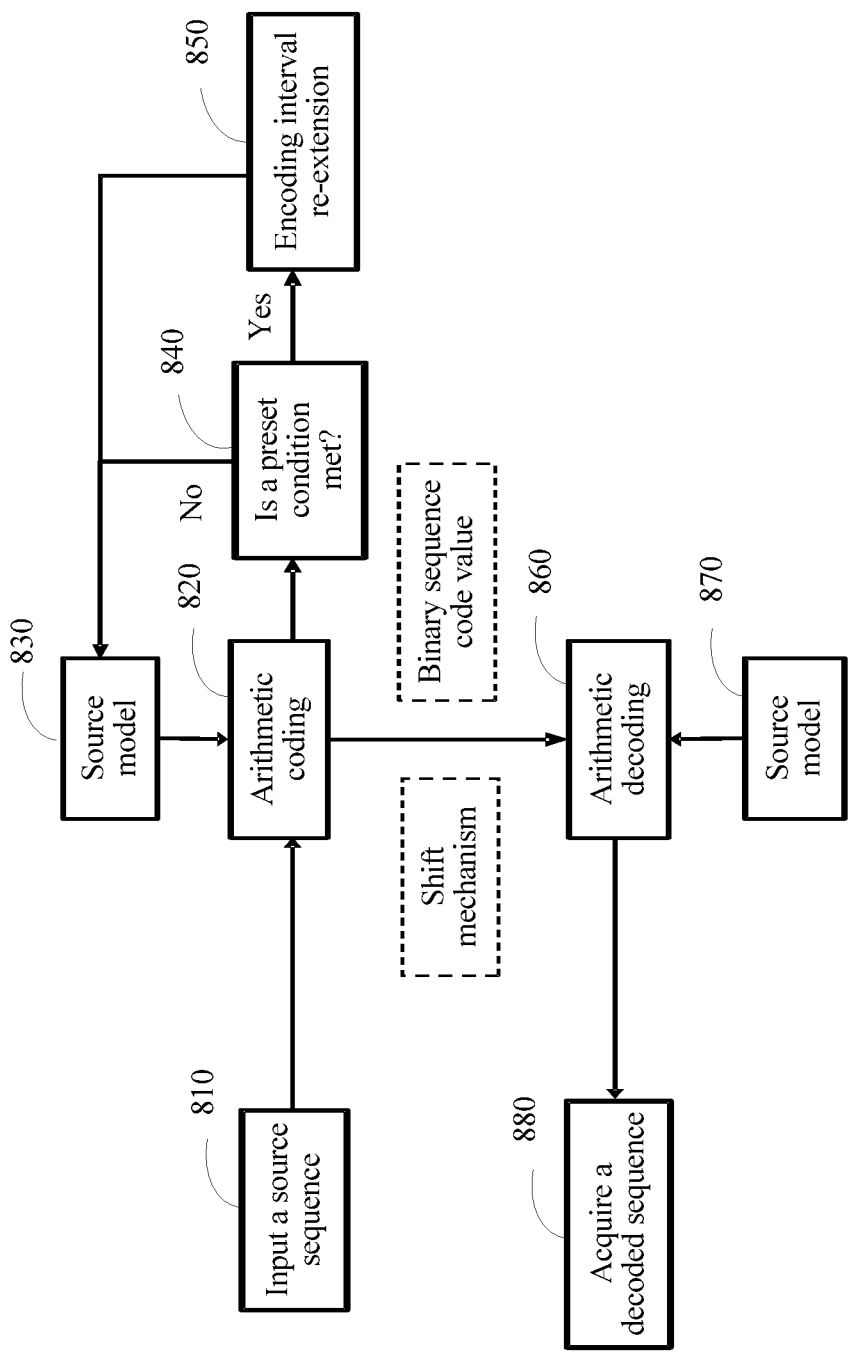
FIG. 8 is a schematic flowchart of a data processing method according to another embodiment of the present invention.

FIG. 8 is a schematic flowchart of a data processing method according to another embodiment of the present invention. The method in FIG. 8 displays an arithmetic coding process and an arithmetic decoding process that are based on encoding interval re-extension. The method in FIG. 8 includes the following steps.

810. Input a source sequence.

Specifically, the sequence may be a string sequence of source data, for example, may be a data type combining digits and letters, or may be a data type with only digits or only letters, for example, the inputted sequence may be a data document number, an index number of a book, a bus license plate number, a product document number, an IMSI, or an IMEI, or phonetic symbols corresponding to Chinese, Korean, or Japanese, or the like.

820. Source model.

Specifically, the source model includes a probability value of each character. A data processing device may perform arithmetic coding on the source sequence according to the source model.

830. Arithmetic coding.

Specifically, a string of the data is gradually encoded according to the source model by using an arithmetic coding algorithm.

840. Is a preset condition met?

Specifically, it is determined whether a quantity of encoded characters of the data reaches a preset character quantity threshold or whether a length of an encoding interval of the data is less than a preset threshold. If the quantity of encoded characters of the data reaches the preset character quantity threshold or the length of the encoding interval of the data is less than the preset threshold, step 850 is performed. If the quantity of encoded characters of the data does not reach the preset character quantity threshold or the length of the encoding interval of the data is not less than the preset threshold, step 840 is performed.

850. Encoding interval re-extension.

When the preset condition is met, the encoding interval of the data is re-extended; the data continues to be encoded according to a re-extended encoding interval by using the arithmetic coding algorithm, so as to obtain a code value interval; and finally, a code value of the source sequence is obtained.

For example, current data includes a string including 12 characters, and a preset threshold is 0.05. When the 12 strings of the current data are encoded by using an arithmetic coding algorithm and when an encoding interval is less than 0.05, the encoding interval of the data is re-extended. For example, when an encoding interval of the seventh character is 0.1, and an encoding interval of the eighth character is 0.04, the encoding interval 0.04 of the eighth character is re-extended, for example, 0.04 is extended to 1, 10, or the like. The data (the ninth to twelfth characters) continues to be encoded according to a re-extended encoding interval (1 or 10) by using the arithmetic coding algorithm, so as to obtain a code value interval (an encoding interval corresponding to the twelfth character).

For another example, current data includes a string including 12 characters, and a preset threshold is 0.05. When the 12 strings of the current data are encoded by using an arithmetic coding algorithm and when an encoding interval is less than 0.05, the encoding interval of the data is re-extended. For example, when an encoding interval of the seventh character is 0.1, and an encoding interval of the eighth character is 0.04, the encoding interval 0.04 of the eighth character is re-extended, for example, 0.04 is extended to 1, 10, or the like. The data (the ninth to twelfth characters) continues to be encoded according to a re-extended encoding interval (1 or 10) by using the arithmetic coding algorithm, so as to obtain a code value interval (an encoding interval corresponding to the twelfth character).

860. Arithmetic decoding.

Specifically, for example, an inverse operation is accordingly performed, that is, interval scaling is performed according to the source model and encoding information during decoding if interval extension is performed during encoding.

It should be noted that all information for performing the interval extension is also sent to a decoder, that is, when transferring a binary code value to the decoder, an encoder also sends shift mechanism information to the decoder, so as to synchronize information and ensure that a correct decoding result is obtained during decoding.

870. Source model.

Corresponding to the source model in step 820, specifically, the source model includes a probability value of each character. A data decoding device may perform arithmetic decoding on the source sequence according to the source model.

880. Obtain a decoded sequence.

Specifically, the decoded sequence may be the same as the source sequence.

With an increase of a length of a string of data, a length of an encoding interval obtained by means of encoding is increasingly shorter, and it is difficult to obtain an appropriate code value from a shorter encoding interval length. Therefore, possible occurrence of a problem that arithmetic coding cannot be correctly performed is avoided as much as possible, and an appropriate code value can be obtained more easily, which avoids incorrect encoding and implements correct encoding. In addition, in this embodiment of the present invention, performing the interval re-extension can use space with a limited quantity of bits to represent sufficiently long string data.

Figure 9:
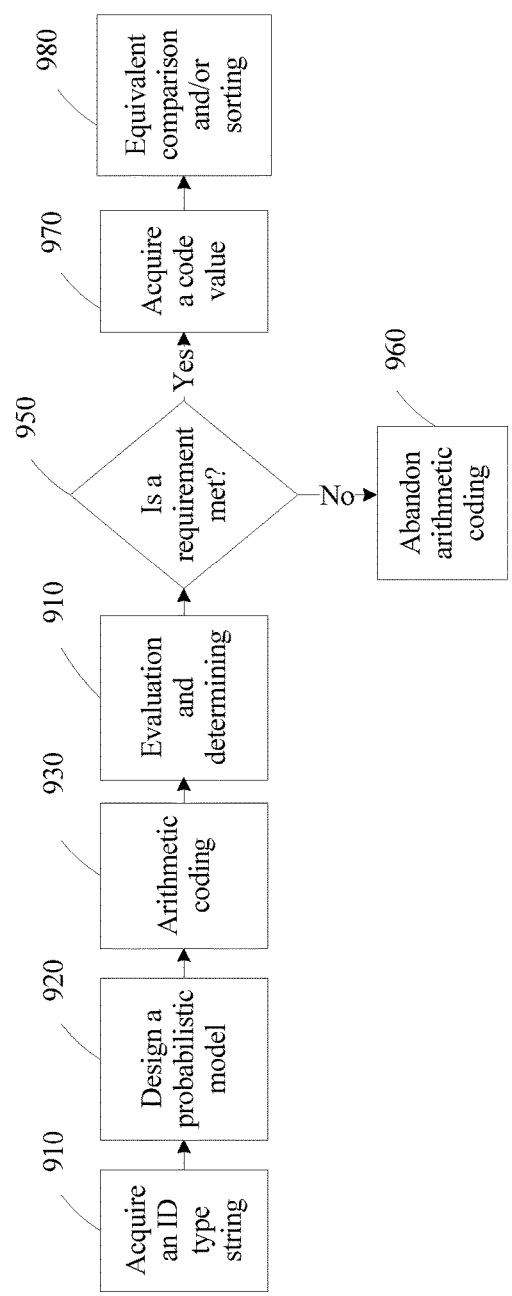
FIG. 9 is a schematic flowchart of a data processing method according to another embodiment of the present invention.

FIG. 9 is a schematic flowchart of a data processing method according to another embodiment of the present invention. The method in FIG. 9 displays an arithmetic coding process and a search operation process of an ID type string. The method in FIG. 9 includes the following steps.

910. Obtain an ID type string.

Specifically, the ID type string may be a string with a lower appearance probability of a letter and a higher appearance probability of a digit, such as a data document number, an index number of a book, or a bus license plate number. For example, generally, a letter occupies only one bit or two bits in a string.

920. Design a probabilistic model.

Specifically, the probabilistic model includes a probability of each character.

930. Arithmetic coding.

Specifically, the string of data is gradually encoded according to the probabilistic model by using an arithmetic coding algorithm.

940. Evaluation and determining.

Specifically, it is determined whether a code value corresponding to the data exists in an encoding interval. In other words, it is determined whether a code value may be selected. If a code value may be selected, it is determined whether a quantity of bits of the code value meets a requirement, for example, it is determined whether the quantity of bits of the code value is less than a quantity of bits of the data.

950. Is a requirement met?

If the requirement is met, step 970 is performed. If the requirement is not met, step 960 is performed.

960. Abandon arithmetic coding.

970. Obtain a code value.

Specifically, the code value corresponding to the ID type string is determined from the code value interval.

980. Equivalent comparison and/or sorting.

Specifically, an equivalent comparison operation of the data may be performed according to the code value. When the code value is equal to a to-be-compared code value, it is determined that the data and data corresponding to the to-be-compared code value are the same data. Specifically, performing an equivalent comparison of code values may be understood as performing data matching. For example, when two code values are equal, it may be determined that pieces of data corresponding to the two code values are the same data, that is, matching is successful. When the two code values are not equal, it may be determined that the pieces of data corresponding to the two code values are different data, that is, matching is unsuccessful.

Sorting of the data may further be performed according to the code value. For example, a location of the code value in a to-be-sorted code value is determined according to the code value, where the location of the code value is used to represent a location of the data in data corresponding to the to-be-sorted code value. Specifically, performing the sorting of the data may be understood as sorting multiple pieces of data. For example, there are five pieces of data, the five pieces of data are corresponding to five code values, and the five code values are sorted in ascending order. For example, when a current code value is the fourth code value in the five code values, a piece of data corresponding to the fourth code value is sorted in the fourth place in the five pieces of data.

Figure 10:
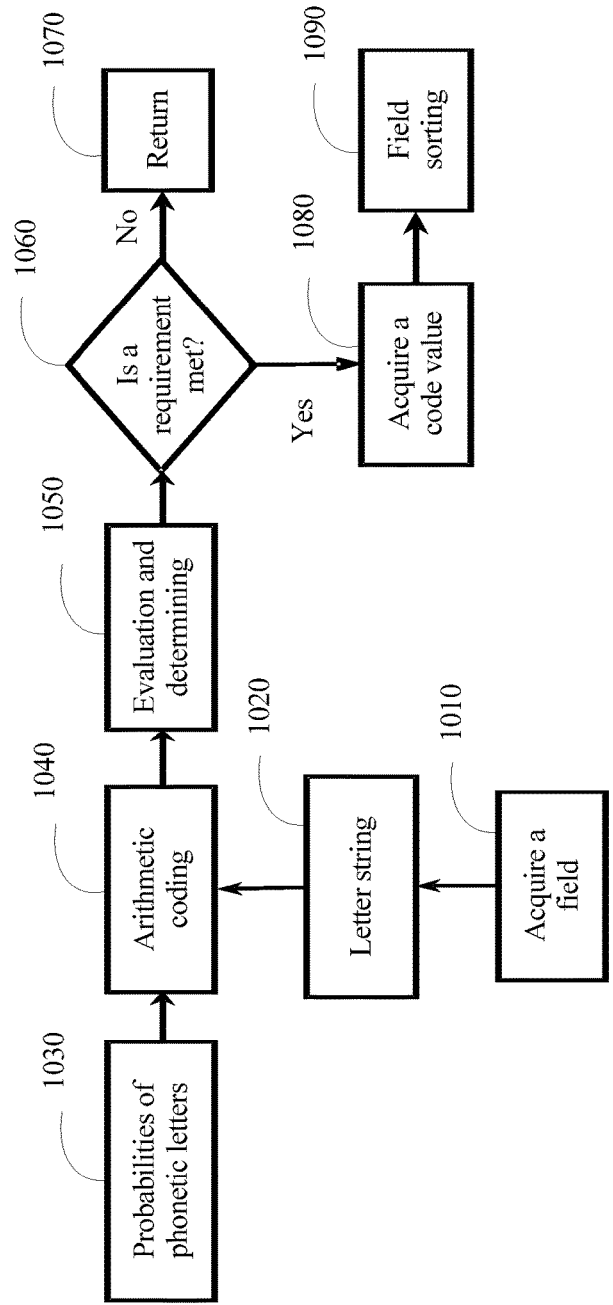
FIG. 10 is a schematic flowchart of a data processing method according to another embodiment of the present invention.

FIG. 10 is a schematic flowchart of a data processing method according to another embodiment of the present invention. The method in FIG. 10 displays an arithmetic coding process and a field sorting process of a letter string of a field. The method in FIG. 10 includes the following steps.

1010. Obtain a field.

Specifically, the field may be a Chinese field, a Korean field, or a Japanese field, and is not limited thereto in this embodiment of the present invention. The field may further be another field converted into a letter string by using phonetic symbols. For example, the field may be Chinese fields such as "excellent", "good", and "pass".

1020. Letter string.

Specifically, the field is converted into the letter string. For example, letter strings corresponding to "excellent", "good", and "pass" are "you xiu", "liang hao", and "ji ge" respectively.

1030. Probabilities of phonetic letters.

Specifically, a probability of each letter is obtained. For example, distribution of appearance probabilities of Chinese phonetic letters (all Chinese phonetic letters) is A (0.107), B (0.014), C (0.017), D (0.030), E (0.062), F (0.009), G (0.060), H (0.067), I (0.141), J (0.023), K (0.008), L (0.017), M (0.014), N (0.117), 0 (0.065), P (0.008), Q (0.013), R (0.006), S (0.026), T (0.015), U (0.096), V (0.001), W (0.001), X (0.020), Y (0.028), and Z (0.026).

1040. Arithmetic coding.

Specifically, encoding is performed according to the foregoing probabilities of the phonetic letters by using an arithmetic coding algorithm.

1050. Evaluation and determining.

Specifically, it is determined whether a code value corresponding to the data exists in an encoding interval. In other words, it is determined whether a code value may be selected. If a code value may be selected, it is determined whether a quantity of bits of the code value meets a requirement, for example, it is determined whether the quantity of bits of the code value is less than a quantity of bits of the data.

1060. Is a requirement met?

If the requirement is met, step 108o is performed. If the requirement is not met, step 1070 is performed.

1070. Return.

1080. Obtain a code value.

Specifically, the code value corresponding to the letter string is determined from the code value interval.

1090. Field sorting.

For example, fields "excellent", "good", and "pass" are sorted according to a letter sequence and are encoded. A letter string corresponding to "excellent" is "you xiu", and a code value corresponding to "excellent" is 0.96684845. A letter string corresponding to "good" is "liang hao", and a code value corresponding to "good" is 0.544375656. A letter string corresponding to "pass" is "ji ge", and a code value corresponding to "pass" is 0.516228. Sequential sorting of the code values in ascending order is 0.516228, 0.544375656, and 0.96684845, and 0.516228, 0.544375656, and 0.96684845 are corresponding to "pass", "good", and "excellent" respectively.

Figure 11:
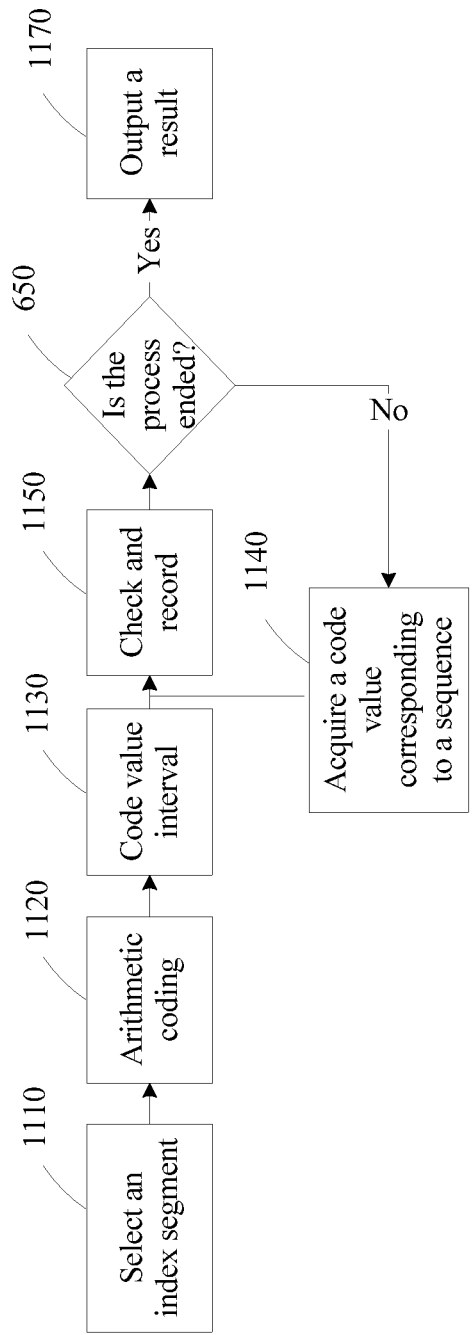
FIG. 11 is a schematic flowchart of a data processing method according to another embodiment of the present invention.

FIG. 11 is a schematic flowchart of a data processing method according to another embodiment of the present invention. The method in FIG. 11 displays a fuzzy search process based on arithmetic coding. The method in FIG. 11 includes the following steps.

1110. Select an index segment.

Specifically, the prefix string segment that needs to be fuzzily searched is obtained. For example, the index segment is "210".

1120. Arithmetic coding.

Specifically, the index segment is encoded according to an arithmetic coding algorithm.

1130. Code value interval.

Specifically, the code value interval of the index segment is obtained. For example, for integer set space {0, 1, 2, 3}, appearance probability distribution is {0.2, 0.5, 0.2, 0.1}. For "210", a code value interval of "210" is [0.74, 0.76].

1140. Obtain a code value corresponding to a sequence.

Specifically, the code value corresponding to the sequence that needs to be fuzzily searched is obtained. For example, code value intervals corresponding to 212132, 210312, 210231, and 211123 are 0.8238, 0.7592, 0.7576, and 0.7923 respectively.

1150. Check and record.

Specifically, a fuzzy search is performed according to the code value corresponding to the sequence and the code value interval of the index segment and a result is recorded. For example, a code value interval of "210" is [0.74, 0.76], and code value intervals corresponding to 212132, 210312, 210231, and 211123 are 0.8238, 0.7592, 0.7576, and 0.7923 respectively. Because 0.7592 and 0.7576 fall within an encoding interval [0.74, 0.76] of the prefix string that needs to be fuzzily searched, and 0.8238 and 0.7923 fall outside the encoding interval of the prefix string that needs to be fuzzily searched, 210312 and 210231 meet a fuzzy search condition, and 212132 and 211123 do not meet the fuzzy search condition.

1160. Is the process ended?

Specifically, if the fuzzy search ends, step 1170 is performed. If the fuzzy search does not end, step 1140 is performed, so as to obtain a code value corresponding to another sequence.

1170. Output a result.

It should be noted that the examples in FIG. 7 to FIG. 11 are intended to help a person skilled in the art better understand the embodiments of the present invention instead of limiting the scope of the embodiments of the present invention. A person skilled in the art certainly can make various equivalent modifications or changes according to the examples provided in FIG. 7 to FIG. 11, and such modifications or changes also fall within the scope of the embodiments of the present invention.

It should be understood that sequence numbers of the foregoing processes do not mean execution sequences. The execution sequences of the processes should be determined according to functions and internal logic of the processes, and should not be construed as any limitation on the implementation processes of the embodiments of the present invention.

The foregoing describes the data processing method in the embodiments of the present invention in detail with reference to FIG. 1 to FIG. 11. The following describes a data processing device in the embodiments of the present invention with reference to FIG. 12 to FIG. 19.

Figure 12:
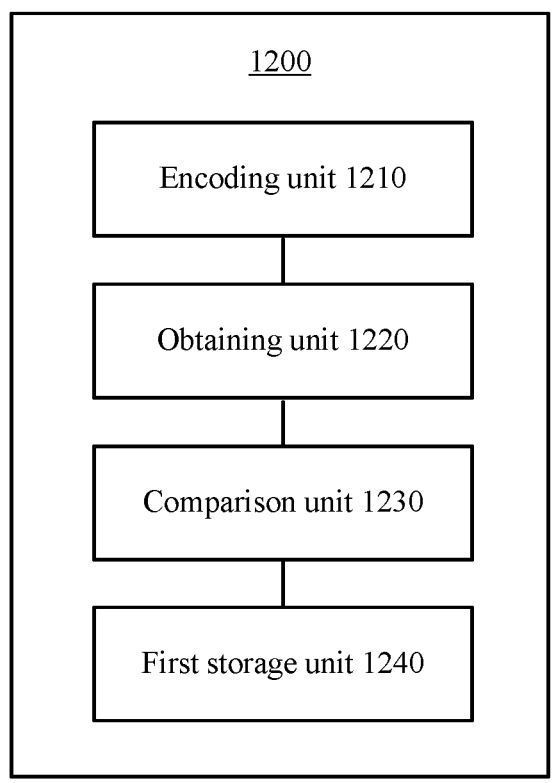
FIG. 12 is a schematic block diagram of a data processing device according to an embodiment of the present invention.

FIG. 12 is a schematic block diagram of a data processing device according to an embodiment of the present invention. A data processing device 1200 in FIG. 12 may be an encoding device. The data processing device 1200 in FIG. 12 includes an encoding unit 1210, an obtaining unit 1220, a comparison unit 1230, and a first storage unit 1240.

Specifically, the encoding unit 1210 is configured to encode data by using an arithmetic coding algorithm, so as to obtain a code value interval; the obtaining unit 1220 is configured to obtain, when a code value corresponding to the data exists in the code value interval, the code value according to the code value interval; the comparison unit 1230 is configured to compare a quantity of bits of the code value with a quantity of bits of the data, so as to obtain a comparison result; and the first storage unit 1240 is configured to perform a storage operation according to the comparison result.

Therefore, in this embodiment of the present invention, data is encoded by using an arithmetic coding algorithm, so as to obtain a code value interval; when a code value corresponding to the data exists in the code value interval, the code value is obtained according to the code value interval; a quantity of bits of the code value is compared with a quantity of bits of the data, so as to obtain a comparison result; and a storage operation is performed according to the comparison result. In this embodiment of the present invention, incorrect encoding can be reduced, and data storage space can be reduced.

Optionally, in another embodiment, the comparison result is that the quantity of bits of the code value is less than the quantity of bits of the data, and the first storage unit saves the code value according to the comparison result.

Alternatively, in another embodiment, the comparison result is that the quantity of bits of the code value is greater than or equal to the quantity of bits of the data, and the first storage unit saves the data according to the comparison result.

Optionally, in another embodiment, the device further includes an application unit, configured to perform an application operation of the data according to the code value. The application operation includes at least one of an equivalent comparison, sorting, or a fuzzy search.

Optionally, in another embodiment, the data is an ID type string, the application operation includes the equivalent comparison, and the application unit performs the equivalent comparison of the data according to the code value.

Specifically, in the another embodiment, when the code value is equal to a to-be-compared code value, the application unit determines that the data and data corresponding to the to-be-compared code value are the same data.

Alternatively, in another embodiment, the data is an ID type string or a letter string of a field, the application operation includes sorting, and the application unit performs the sorting of the data according to the code value.

Specifically, in the another embodiment, the application unit determines a location of the code value in a to-be-sorted code value according to the code value. The location of the code value is used to represent a location of the data in data corresponding to the to-be-sorted code value.

Alternatively, in another embodiment, the application operation includes the fuzzy search, and the application unit performs the fuzzy search on the data according to the code value.

Specifically, in the another embodiment, the application unit determines, according to whether the code value falls within an encoding interval of a prefix string that needs to be fuzzily searched, whether the data includes the prefix string. When the code value falls within the encoding interval of the prefix string that needs to be fuzzily searched, the data includes the prefix string, or when the code value falls outside the encoding interval of the prefix string that needs to be fuzzily searched, the data does not include the prefix string.

Optionally, in another embodiment, the encoding unit 1210 encodes the data by using the arithmetic coding algorithm, so as to obtain an encoding interval; re-extends the encoding interval of the data, so as to obtain a re-extended encoding interval; and continues to encode the data according to the re-extended encoding interval by using the arithmetic coding algorithm, so as to obtain the code value interval.

Further, when at least one of the following conditions is met, the encoding unit 1210 re-extends the encoding interval of the data, so as to obtain the re-extended encoding interval and record a location of a corresponding re-extended character: a quantity of encoded characters of the data reaches a character quantity threshold or a length of the encoding interval of the data is less than an interval threshold.

Optionally, in another embodiment, the device further includes a determining unit, configured to determine, before the obtaining unit 1220 obtains the code value, whether an appropriate code value corresponding to the data exists in the code value interval.

Optionally, in another embodiment, the device further includes a second storage unit, configured to save the data when no appropriate code value corresponding to the data exists in the code value interval.

It should be understood that the data processing device in FIG. 12 is corresponding to the data processing method in FIG. 1, the data processing device in FIG. 12 can implement processes of the data processing method in FIG. 1, and for a function of the data processing device in FIG. 12, refer to relevant description of the data processing method in FIG. 1. To avoid repetition, details are not described herein again.

Figure 13:
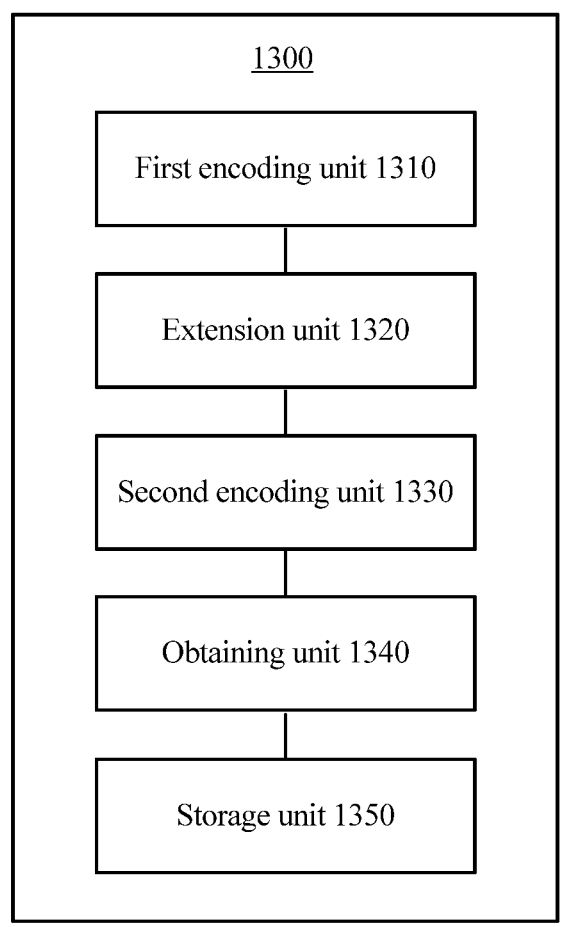
FIG. 13 is a schematic block diagram of a data processing device according to another embodiment of the present invention.

FIG. 13 is a schematic block diagram of a data processing device according to another embodiment of the present invention. The data processing device 1300 in FIG. 13 may be an encoding device. The device 1300 in FIG. 13 includes a first encoding unit 1310, an extension unit 1320, a second encoding unit 1330, an obtaining unit 1340, and a storage unit 1350.

Specifically, the first encoding unit 1310 is configured to encode data by using an arithmetic coding algorithm, so as to obtain an encoding interval, the extension unit 1320 is configured to re-extend the encoding interval of the data, so as to obtain a re-extended encoding interval, the second encoding unit 1330 is configured to continue to encode the data according to the re-extended encoding interval by using the arithmetic coding algorithm, so as to obtain a code value interval, the obtaining unit 1340 is configured to obtain a code value according to the code value interval, and the storage unit 1350 is configured to save the code value.

Therefore, in this embodiment of the present invention, encoding interval re-extension is performed on an encoding interval of data. Because the encoding interval is re-extended, a code value interval is accordingly expanded. Therefore, in this embodiment of the present invention, an appropriate code value can be obtained more easily from an expanded code value interval, which avoids incorrect encoding, and implements correct encoding. In addition, in this embodiment of the present invention, performing the interval re-extension can use space with a limited quantity of bits to represent sufficiently long string data.

Optionally, in another embodiment, when at least one of the following conditions is met, the extension unit 1320 re-extends the encoding interval of the data, so as to obtain the re-extended encoding interval and record a location of a corresponding re-extended character: a quantity of encoded characters of the data reaches a character quantity threshold or a length of the encoding interval of the data is less than an interval threshold.

It should be understood that the data processing device in FIG. 13 is corresponding to the data processing method in FIG. 4, the data processing device in FIG. 13 can implement processes of the data processing method in FIG. 4, and for a function of the data processing device in FIG. 13, refer to relevant description of the data processing method in FIG. 4. To avoid repetition, details are not described herein again.

Figure 14:
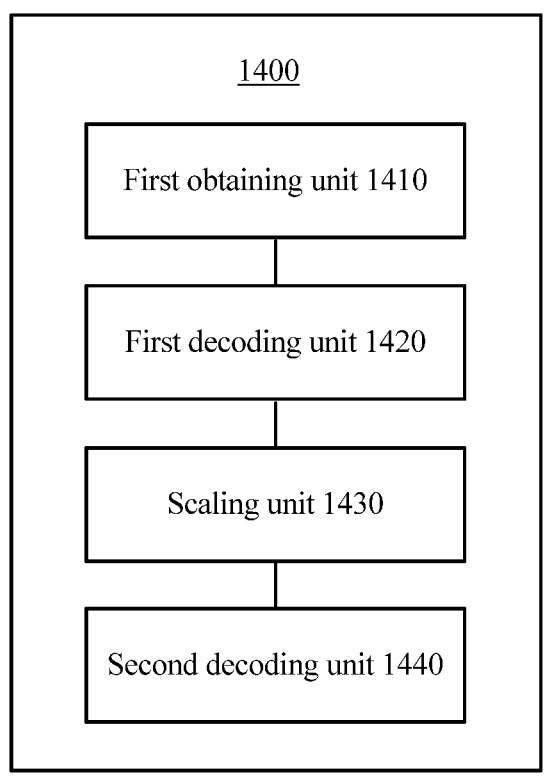
FIG. 14 is a schematic block diagram of a data processing device according to another embodiment of the present invention.

FIG. 14 is a schematic block diagram of a data processing device according to another embodiment of the present invention. The data processing device 1400 in FIG. 14 may be a decoding device. The device 1400 in FIG. 14 includes a first obtaining unit 1410, a first decoding unit 1420, a scaling unit 1430, and a second decoding unit 1440.

Specifically, the first obtaining unit 1410 is configured to obtain a code value of data and a location of a re-extended character, the first decoding unit 1420 is configured to decode the code value of the data by using an arithmetic coding algorithm, so as to obtain a decoding interval, the scaling unit 1430 is configured to re-scale the decoding interval of the data according to the location of the re-extended character, so as to obtain a re-scaled decoding interval, and the second decoding unit 1440 is configured to continue to decode the data according to the re-scaled decoding interval by using the arithmetic coding algorithm, so as to obtain the data.

Therefore, in this embodiment of the present invention, decoding interval re-scaling is performed according to a code value in a re-extended encoding interval, which avoids incorrect decoding, and implements correct decoding.

Optionally, in another embodiment, the scaling unit 1430 determines a location of a re-scaled character according to the location of the re-extended character, where the location of the re-extended character is inverse to the location of the re-scaled character; and re-scales the decoding interval of the data according to the location of the re-scaled character, so as o obtain the re-scaled decoding interval.

It should be understood that the data processing device in FIG. 14 is corresponding to the data processing method in FIG. 5, the data processing device in FIG. 14 can implement processes of the data processing method in FIG. 5, and for a function of the data processing device in FIG. 14, refer to relevant description of the data processing method in FIG. 5. To avoid repetition, details are not described herein again.

Figure 15:
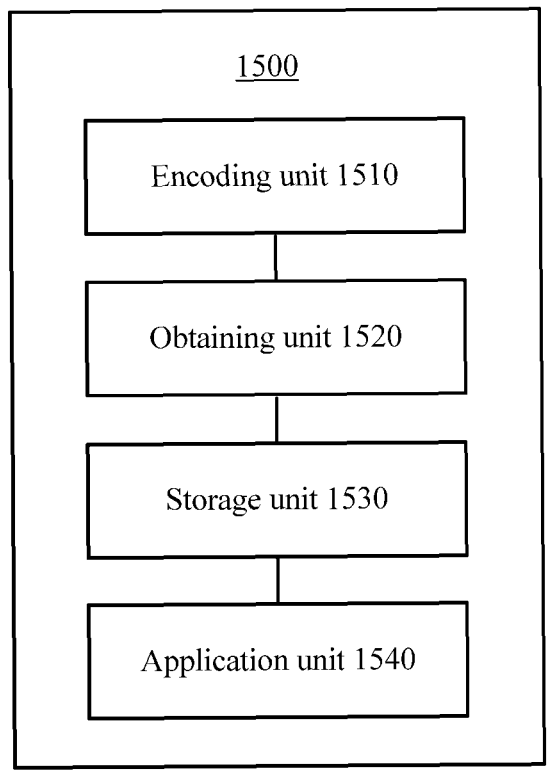
FIG. 15 is a schematic block diagram of a data processing device according to another embodiment of the present invention.

FIG. 15 is a schematic block diagram of a data processing device according to another embodiment of the present invention. The data processing device 1500 in FIG. 15 may be an encoding device. The device 1500 in FIG. 15 includes an encoding unit 1510, an obtaining unit 1520, a storage unit 1530, and an application unit 1540.

Specifically, the encoding unit 1510 is configured to encode data by using an arithmetic coding algorithm, so as to obtain a code value interval; the obtaining unit 1520 is configured to obtain a code value according to the code value interval; the storage unit 1530 is configured to save the code value; and the application unit 1540 is configured to perform an application operation of the data according to the code value, where the application operation includes at least one of an equivalent comparison, sorting, or a fuzzy search.

Therefore, in this embodiment of the present invention, a code value is obtained by means of data encoding, at least one application of an equivalent comparison, sorting, or a fuzzy search of data is performed according to the code value, which is different from the prior art that an equivalent comparison, sorting, and a fuzzy search of data are performed according to the source data, and an application of the original complex data is equivalent to corresponding processing performed by using the code value, which is quicker and simpler.

Optionally, in another embodiment, the data is an ID type string, the application operation includes the equivalent comparison, and the application unit 1540 performs the equivalent comparison of the data according to the code value.

Specifically, in the another embodiment, the application unit 1540 determines, when the code value is equal to a to-be-compared code value, that the data and data corresponding to the to-be-compared code value are the same data.

Alternatively, in another embodiment, the data is an ID type string or a letter string of a field, the application operation includes sorting, and the application unit 1540 performs the sorting of the data according to the code value.

Specifically, in the another embodiment, the application unit 1540 determines a location of the code value in a to-be-sorted code value according to the code value. The location of the code value is used to represent a location of the data in data corresponding to the to-be-sorted code value.

Alternatively, in another embodiment, the application operation includes the fuzzy search, and the application unit 1540 performs the fuzzy search on the data according to the code value.

Specifically, in the another embodiment, the application unit 1540 determines, according to whether the code value falls within an encoding interval of a prefix string that needs to be fuzzily searched, whether the data includes the prefix string. When the code value falls within the encoding interval of the prefix string that needs to be fuzzily searched, the data includes the prefix string, or when the code value falls outside the encoding interval of the prefix string that needs to be fuzzily searched, the data does not include the prefix string.

It should be understood that the data processing device in FIG. 15 is corresponding to the data processing method in FIG. 6, the data processing device in FIG. 15 can implement processes of the data processing method in FIG. 6, and for a function of the data processing device in FIG. 15, refer to relevant description of the data processing method in FIG. 6. To avoid repetition, details are not described herein again.

Figure 16:
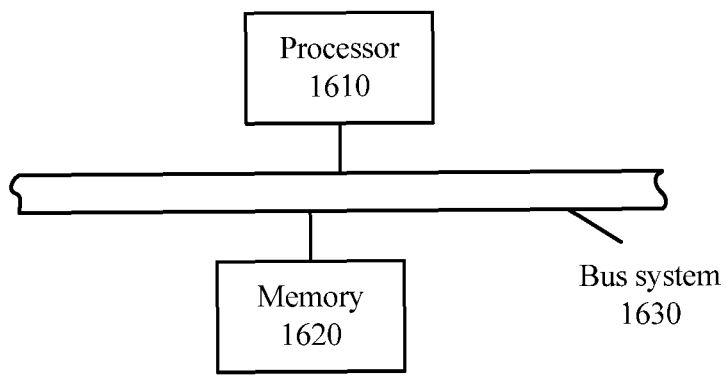
FIG. 16 is a schematic block diagram of a data processing device according to another embodiment of the present invention.

FIG. 16 is a schematic block diagram of a data processing device according to another embodiment of the present invention. The data processing device 1600 in FIG. 16 may be an encoding device. The data processing device 1600 in FIG. 16 includes a processor 1610, a memory 1620, and a bus system 1630.

Specifically, the processor 1610 invokes, by using the bus system 1630, code saved in the memory 1620 and encodes data by using an arithmetic coding algorithm, so as to obtain a code value interval; when a code value corresponding to the data exists in the code value interval, obtains the code value according to the code value interval; compares a quantity of bits of the code value with a quantity of bits of the data, so as to obtain a comparison result; and performs a storage operation according to the comparison result.

In this embodiment of the present invention, data is encoded by using an arithmetic coding algorithm, so as to obtain a code value interval; when a code value corresponding to the data exists in the code value interval, the code value is obtained according to the code value interval; a quantity of bits of the code value is compared with a quantity of bits of the data, so as to obtain a comparison result; and a storage operation is performed according to the comparison result. In this embodiment of the present invention, incorrect encoding can be reduced, and data storage space can be reduced.

The methods disclosed in the foregoing embodiments of the present invention may be applied to the processor 1610, or implemented by the processor 1610. The processor 1610 may be an integrated circuit chip and has a signal processing capability. In an implementation process, the steps in the foregoing methods may be completed by using an integrated logic circuit of hardware in the processor 1610 or an instruction in a form of software. The foregoing processor 1610 may be a general purpose processor, a digital signal processor (Digital Signal Processor in English, DSP for short), an application-specific integrated circuit (Application Specific Integrated Circuit in English, ASIC for short), a field programmable gate array (Field Programmable Gate Array in English, FPGA for short), or another programmable logic device, a discrete gate, or a transistor logic device, or a discrete hardware assembly, which may implement or execute the methods, steps, and logical block diagrams that are disclosed in the embodiments of the present invention. The general purpose processor may be a microprocessor or the processor may be any conventional processor, or the like. The steps of the methods disclosed with reference to the embodiments of the present invention may be directly executed and completed by a hardware decoding processor, or executed and completed by a combination of hardware and software modules in the decoding processor. The software module may be located in a mature storage medium in the art such as a random access memory (Random Access Memory in English, RAM for short), a flash memory, a read-only memory (Read-Only Memory in English, ROM for short), a programmable read-only memory, or an electrically erasable programmable memory, or a register. The storage medium is located in the memory 1620. The processor 1610 reads information in the memory 1620, and completes the steps of the foregoing methods with reference to hardware of the processor 1610. In addition to a data bus, the bus system 1630 may further include a power bus, a control bus, a state signal bus, and the like. However, for clarity of description, various buses are marked as the bus system 1630 in the figure.

Optionally, in another embodiment, the comparison result is that the quantity of bits of the code value is less than the quantity of bits of the data, and the processor 1610 saves the code value according to the comparison result.

Alternatively, in another embodiment, the comparison result is that the quantity of bits of the code value is greater than or equal to the quantity of bits of the data, and the processor 1610 saves the data according to the comparison result.

Optionally, in another embodiment, the device further includes: the processor 1610 is configured to perform an application operation of the data according to the code value. The application operation includes at least one of an equivalent comparison, sorting, or a fuzzy search.

Optionally, in another embodiment, the data is an ID type string, the application operation includes the equivalent comparison, and the processor 1610 performs the equivalent comparison of the data according to the code value.

Specifically, in the another embodiment, the processor 1610 determines, when the code value is equal to a to-be-compared code value, that the data and data corresponding to the to-be-compared code value are the same data.

Alternatively, in another embodiment, the data is an ID type string or a letter string of a field, the application operation includes sorting, and the processor 1610 performs the sorting of the data according to the code value.

Specifically, in the another embodiment, the processor 1610 determines a location of the code value in a to-be-sorted code value according to the code value. The location of the code value is used to represent a location of the data in data corresponding to the to-be-sorted code value.

Alternatively, in another embodiment, the application operation includes the fuzzy search, and the processor 1610 performs the fuzzy search on the data according to the code value.

Specifically, in the another embodiment, the processor 1610 determines, according to whether the code value falls within an encoding interval of a prefix string that needs to be fuzzily searched, whether the data includes the prefix string. When the code value falls within the encoding interval of the prefix string that needs to be fuzzily searched, the data includes the prefix string, or when the code value falls outside the encoding interval of the prefix string that needs to be fuzzily searched, the data does not include the prefix string.

Optionally, in another embodiment, the processor 1610 encodes the data by using the arithmetic coding algorithm, so as to obtain an encoding interval; re-extends the encoding interval of the data, so as to obtain a re-extended encoding interval; and continues to encode the data according to the re-extended encoding interval by using the arithmetic coding algorithm, so as to obtain the code value interval.

Further, when at least one of the following conditions is met, the processor 161o re-extends the encoding interval of the data, so as to obtain the re-extended encoding interval and record a location of a corresponding re-extended character: a quantity of encoded characters of the data reaches a character quantity threshold or a length of the encoding interval of the data is less than an interval threshold.

Optionally, in another embodiment, before obtaining the code value, the processor 1610 determines whether an appropriate code value corresponding to the data exists in the code value interval.

Optionally, in another embodiment, when no appropriate code value corresponding to the data exists in the code value interval, the processor 1610 saves the data.

It should be understood that the data processing device in FIG. 16 is corresponding to the data processing method in FIG. 1, the data processing device in FIG. 16 can implement processes of the data processing method in FIG. 1, and for a function of the data processing device in FIG. 16, refer to relevant description of the data processing method in FIG. 1. To avoid repetition, details are not described herein again.

Figure 17:
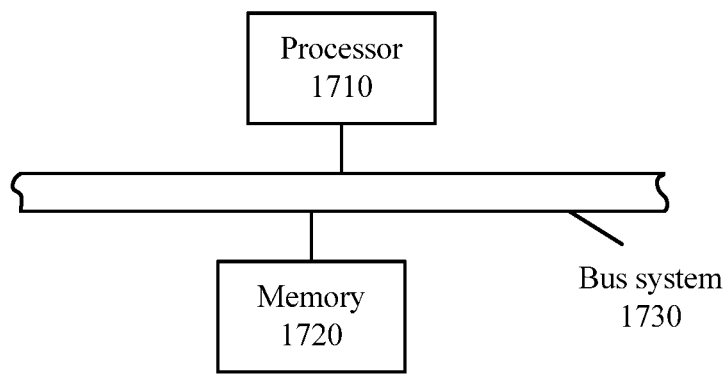
FIG. 17 is a schematic block diagram of a data processing device according to another embodiment of the present invention.

FIG. 17 is a schematic block diagram of a data processing device according to another embodiment of the present invention. The data processing device 1700 in FIG. 17 may be an encoding device. The device 1700 in FIG. 17 includes a processor 1710, a memory 1720, and a bus system 1730.

Specifically, the processor 1710 invokes, by using the bus system 1730, code saved in the memory 1720 and encodes data by using an arithmetic coding algorithm, so as to obtain an encoding interval; re-extends the encoding interval of the data, so as to obtain a re-extended encoding interval; continues to encode the data according to the re-extended encoding interval by using the arithmetic coding algorithm, so as to obtain a code value interval; obtains a code value according to the code value interval; and saves the code value.

Therefore, in this embodiment of the present invention, encoding interval re-extension is performed on an encoding interval of data. Because the encoding interval is re-extended, a code value interval is accordingly expanded. Therefore, in this embodiment of the present invention, an appropriate code value can be obtained more easily from an expanded code value interval, which avoids incorrect encoding, and implements correct encoding. In addition, in this embodiment of the present invention, performing the interval re-extension can use space with a limited quantity of bits to represent sufficiently long string data.

The methods disclosed in the foregoing embodiments of the present invention may be applied to the processor 1710, or implemented by the processor 1710. The processor 1710 may be an integrated circuit chip and has a signal processing capability. In an implementation process, the steps in the foregoing methods may be completed by using an integrated logic circuit of hardware in the processor 1710 or an instruction in a form of software. The foregoing processor 1710 may be a general purpose processor, a digital signal processor (Digital Signal Processor in English, DSP for short), an application-specific integrated circuit (Application Specific Integrated Circuit in English, ASIC for short), a field programmable gate array (Field Programmable Gate Array in English, FPGA for short), or another programmable logic device, a discrete gate, or a transistor logic device, or a discrete hardware assembly, which may implement or execute the methods, steps, and logical block diagrams that are disclosed in the embodiments of the present invention. The general purpose processor may be a microprocessor or the processor may be any conventional processor, or the like. The steps of the methods disclosed with reference to the embodiments of the present invention may be directly executed and completed by a hardware decoding processor, or executed and completed by a combination of hardware and software modules in the decoding processor. The software module may be located in a mature storage medium in the art such as a random access memory (Random Access Memory in English, RAM for short), a flash memory, a read-only memory (Read-Only Memory in English, ROM for short), a programmable read-only memory, or an electrically erasable programmable memory, or a register. The storage medium is located in the memory 1720. The processor 1710 reads information in the memory 1720, and completes the steps of the foregoing methods with reference to hardware of the processor 1710. In addition to a data bus, the bus system 1730 may further include a power bus, a control bus, a state signal bus, and the like. However, for clarity of description, various buses are marked as the bus system 1730 in the figure.

Optionally, In another embodiment, when at least one of the following conditions is met, the processor 1710 re-extends the encoding interval of the data, so as to obtain the re-extended encoding interval and record a location of a corresponding re-extended character: a quantity of encoded characters of the data reaches a character quantity threshold or a length of the encoding interval of the data is less than an interval threshold.

It should be understood that the data processing device in FIG. 17 is corresponding to the data processing method in FIG. 4, the data processing device in FIG. 17 can implement processes of the data processing method in FIG. 4, and for a function of the data processing device in FIG. 17, refer to relevant description of the data processing method in FIG. 4. To avoid repetition, details are not described herein again.

Figure 18:
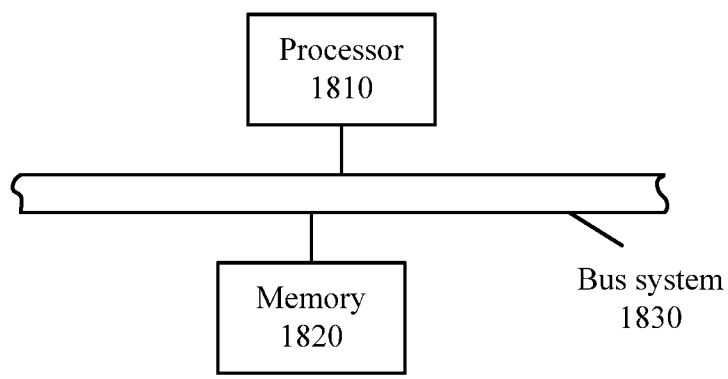
FIG. 18 is a schematic block diagram of a data processing device according to another embodiment of the present invention.

FIG. 18 is a schematic block diagram of a data processing device according to another embodiment of the present invention. The data processing device 1800 in FIG. 18 may be a decoding device. The device 1800 in FIG. 18 includes a processor 1810, a memory 1820, and a bus system 1830.

Specifically, the processor 1810 invokes, by using the bus system 1830, code saved in the memory 1820 to obtain a code value of data and a location of a re-extended character; decodes the code value of the data by using an arithmetic coding algorithm, so as to obtain a decoding interval; re-scales the decoding interval of the data according to the location of the re-extended character, so as to obtain a re-scaled decoding interval; and continues to decode the data according to the re-scaled decoding interval by using the arithmetic coding algorithm, so as to obtain the data.

Therefore, in this embodiment of the present invention, decoding interval re-scaling is performed according to a code value in a re-extended encoding interval, which avoids incorrect decoding, and implements correct decoding.

The methods disclosed in the foregoing embodiments of the present invention may be applied to the processor 1810, or implemented by the processor 1810. The processor 1810 may be an integrated circuit chip and has a signal processing capability. In an implementation process, the steps in the foregoing methods may be completed by using an integrated logic circuit of hardware in the processor 1810 or an instruction in a form of software. The foregoing processor 181o may be a general purpose processor, a digital signal processor (Digital Signal Processor in English, DSP for short), an application-specific integrated circuit (Application Specific Integrated Circuit in English, ASIC for short), a field programmable gate array (Field Programmable Gate Array in English, FPGA for short), or another programmable logic device, a discrete gate, or a transistor logic device, or a discrete hardware assembly, which may implement or execute the methods, steps, and logical block diagrams that are disclosed in the embodiments of the present invention. The general purpose processor may be a microprocessor or the processor may be any conventional processor, or the like. The steps of the methods disclosed with reference to the embodiments of the present invention may be directly executed and completed by a hardware decoding processor, or executed and completed by a combination of hardware and software modules in the decoding processor. The software module may be located in a mature storage medium in the art such as a random access memory (Random Access Memory in English, RAM for short), a flash memory, a read-only memory (Read-Only Memory in English, ROM for short), a programmable read-only memory, or an electrically erasable programmable memory, or a register. The storage medium is located in the memory 1820. The processor 1810 reads information in the memory 1820, and completes the steps of the foregoing methods with reference to hardware of the processor 1810. In addition to a data bus, the bus system 1830 may further include a power bus, a control bus, a state signal bus, and the like. However, for clarity of description, various buses are marked as the bus system 1830 in the figure.

Optionally, in another embodiment, the processor 1810 determines a location of a re-scaled character according to the location of the re-extended character, where the location of the re-extended character is inverse to the location of the re-scaled character; and re-scales the decoding interval of the data according to the location of the re-scaled character, so as o obtain the re-scaled decoding interval.

It should be understood that the data processing device in FIG. 18 is corresponding to the data processing method in FIG. 5, the data processing device in FIG. 18 can implement processes of the data processing method in FIG. 5, and for a function of the data processing device in FIG. 18, refer to relevant description of the data processing method in FIG. 5. To avoid repetition, details are not described herein again.

Figure 19:
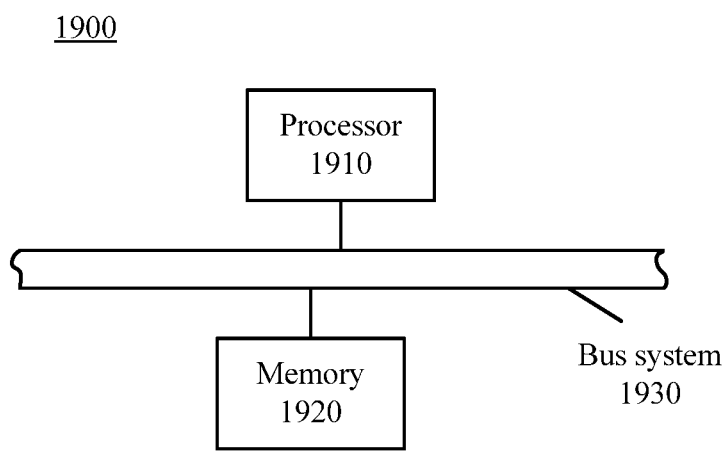
FIG. 19 is a schematic block diagram of a data processing device according to another embodiment of the present invention.

FIG. 19 is a schematic block diagram of a data processing device according to another embodiment of the present invention. The data processing device 1900 in FIG. 19 may be an encoding device. The device 1900 in FIG. 19 includes a processor 1910, a memory 1920, and a bus system 1930.

Specifically, the processor 1910 invokes, by using the bus system 1930, code saved in the memory 1920 and encodes data by using an arithmetic coding algorithm, so as to obtain a code value interval; obtains a code value according to the code value interval; saves the code value; and performs an application operation of the data according to the code value, where the application operation includes at least one of an equivalent comparison, sorting, or a fuzzy search.

Therefore, in this embodiment of the present invention, a code value is obtained by means of data encoding, at least one application of an equivalent comparison, sorting, or a fuzzy search of data is performed according to the code value, which is different from the prior art that an equivalent comparison, sorting, and a fuzzy search of data are performed according to the source data, and an application of the original complex data is equivalent to corresponding processing performed by using the code value, which is quicker and simpler.

The methods disclosed in the foregoing embodiments of the present invention may be applied to the processor 1910, or implemented by the processor 1910. The processor 1910 may be an integrated circuit chip and has a signal processing capability. In an implementation process, the steps in the foregoing methods may be completed by using an integrated logic circuit of hardware in the processor 1910 or an instruction in a form of software. The foregoing processor 1910 may be a general purpose processor, a digital signal processor (Digital Signal Processor in English, DSP for short), an application-specific integrated circuit (Application Specific Integrated Circuit in English, ASIC for short), a field programmable gate array (Field Programmable Gate Array in English, FPGA for short), or another programmable logic device, a discrete gate, or a transistor logic device, or a discrete hardware assembly, which may implement or execute the methods, steps, and logical block diagrams that are disclosed in the embodiments of the present invention. The general purpose processor may be a microprocessor or the processor may be any conventional processor, or the like. The steps of the methods disclosed with reference to the embodiments of the present invention may be directly executed and completed by a hardware decoding processor, or executed and completed by a combination of hardware and software modules in the decoding processor. The software module may be located in a mature storage medium in the art such as a random access memory (Random Access Memory in English, RAM for short), a flash memory, a read-only memory (Read-Only Memory in English, ROM for short), a programmable read-only memory, or an electrically erasable programmable memory, or a register. The storage medium is located in the memory 1920. The processor 1910 reads information in the memory 1920, and completes the steps of the foregoing methods with reference to hardware of the processor 1910. In addition to a data bus, the bus system 1930 may further include a power bus, a control bus, a state signal bus, and the like. However, for clarity of description, various buses are marked as the bus system 1930 in the figure.

Optionally, in another embodiment, the data is an ID type string, the application operation includes the equivalent comparison, and the processor 1910 performs the equivalent comparison of the data according to the code value.

Specifically, in the another embodiment, the processor 1910 determines, when the code value is equal to a to-be-compared code value, that the data and data corresponding to the to-be-compared code value are the same data.

Alternatively, in another embodiment, the data is an ID type string or a letter string of a field, the application operation includes sorting, and the processor 1910 performs the sorting of the data according to the code value.

Specifically, in the another embodiment, the processor 1910 determines a location of the code value in a to-be-sorted code value according to the code value. The location of the code value is used to represent a location of the data in data corresponding to the to-be-sorted code value.

Alternatively, in another embodiment, the application operation includes the fuzzy search, and the processor 1910 performs the fuzzy search on the data according to the code value.

Specifically, in the another embodiment, the processor 1910 determines, according to whether the code value falls within an encoding interval of a prefix string that needs to be fuzzily searched, whether the data includes the prefix string. When the code value falls within the encoding interval of the prefix string that needs to be fuzzily searched, the data includes the prefix string, or when the code value falls outside the encoding interval of the prefix string that needs to be fuzzily searched, the data does not include the prefix string.

It should be understood that the data processing device in FIG. 19 is corresponding to the data processing method in FIG. 6, the data processing device in FIG. 19 can implement processes of the data processing method in FIG. 6, and for a function of the data processing device in FIG. 19, refer to relevant description of the data processing method in FIG. 19. To avoid repetition, details are not described herein again.

It should be understood that "an embodiment" or "an embodiment" mentioned in this specification means that embodiment-related specific features, structures, or characters are included in at least one embodiment of the present invention. Therefore, "in an embodiment" or "in an embodiment" occurring in the entire specification not necessarily refers to the same embodiment. In addition, these specific features, structures, or characters may be combined in one or more embodiments in any appropriate manner. It should be understood that sequence numbers of the foregoing processes do not mean execution sequences in various embodiments of the present invention. The execution sequences of the processes should be determined according to functions and internal logic of the processes, and should not be construed as any limitation on the implementation processes of the embodiments of the present invention.

In addition, the terms "system" and "network" may be used interchangeably in this specification. The term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

It should be understood that in the embodiments of the present invention, "B corresponding to A" indicates that B is associated with A, and B may be determined according to A. However, it should further be understood that determining A according to B does not mean that B is determined according to A only; that is, B may also be determined according to A and/or other information.

A person of ordinary skill in the art may be aware that, in combination with the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments of the present invention.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

With descriptions of the foregoing embodiments, a person skilled in the art may clearly understand that the present invention may be implemented by hardware, firmware or a combination thereof. When the present invention is implemented by software, the foregoing functions may be saved in a computer-readable medium or transmitted as one or more instructions or code in the computer-readable medium. The computer-readable medium includes a computer storage medium and a communications medium, where the communications medium includes any medium that enables a computer program to be transmitted from one place to another. The storage medium may be any available medium accessible to a computer. The following provides an example but does not impose a limitation: The computer-readable medium may include a RAM, a ROM, an EEPROM, a CD-ROM, or another optical disc storage or disk storage medium, or another magnetic storage device, or any other medium that can carry or save expected program code in a form of an instruction or a data structure and can be accessed by a computer. In addition, any connection may be appropriately defined as a computer-readable medium. For example, if software is transmitted from a website, a server or another remote source by using a coaxial cable, an optical fiber/cable, a twisted pair, a digital subscriber line (DSL) or wireless technologies such as infrared ray, radio and microwave, the coaxial cable, optical fiber/cable, twisted pair, DSL or wireless technologies such as infrared ray, radio and microwave are included in fixation of a medium to which they belong. For example, a disk (Disk) and disc (disc) used by the present invention includes a compact disc (CD), a laser disc, an optical disc, a digital versatile disc (DVD), a floppy disk and a Blue-ray disc, where the disk generally copies data by a magnetic means, and the disc copies data optically by a laser means. The foregoing combination should also be included in the protection scope of the computer-readable medium.

In summary, what is described above is merely exemplary embodiments of the technical solutions of the present invention, but is not intended to limit the protection scope of the present invention. Any modification, equivalent replacement, or improvement made without departing from the spirit and principle of the present invention shall fall within the protection scope of the present invention.

What is claimed is:
1. A data processing method, comprising:
  encoding data by using an arithmetic coding algorithm, so as to obtain a code value interval;
  obtaining a code value according to the code value interval when the code value corresponding to the data exists in the code value interval;

comparing a quantity of bits of the code value with a quantity of bits of the data, so as to obtain a comparison result; and performing a storage operation according to the comparison result.

2. The method according to claim 1, wherein the comparison result is that the quantity of bits of the code value is greater than or equal to the quantity of bits of the data, and wherein the performing a storage operation according to the comparison result comprises storing the data according to the comparison result.

3. The method according to claim 1, wherein the comparison result is that the quantity of bits of the code value is less than the quantity of bits of the data; and wherein the performing a storage operation according to the comparison result comprises storing the code value according to the comparison result.

4. The method according to claim 3, further comprising:

performing an application operation of the data according to the code value, wherein the application operation comprises at least one of an equivalent comparison, sorting, or a fuzzy search.

5. The method according to claim 4, wherein the data is an identity (ID) type string, the application operation comprises the equivalent comparison; and Wherein the performing an application operation of the data according to the code value comprises:

determining that the data and data corresponding to a to-be-compared code value are the same data when the code value is equal to the to-be-compared code value.

6. The method according to claim 4, wherein the data is an identity (ID) type string or a letter string of a field, wherein the application operation comprises sorting; and wherein the performing an application operation of the data according to the code value comprises:

determining a location of the code value in a to-be-sorted code value according to the code value, wherein the location of the code value is used to represent a location of the data in data corresponding to the to-be-sorted code value.

7. The method according to claim 4, wherein the application operation comprises the fuzzy search; and wherein the performing an application operation of the data according to the code value comprises:

determining, according to whether the code value falls within an encoding interval of a prefix string that needs to be fuzzily searched, whether the data comprises the prefix string;

wherein the data comprises the prefix string when the code value falls within the encoding interval of the prefix string that needs to be fuzzily searched; and wherein the data does omits the prefix string when the code value falls outside the encoding interval of the prefix string that needs to be fuzzily searched.

8. The method according to claim 1, wherein the encoding data by using the arithmetic coding algorithm, so as to obtain the code value interval, comprises:

encoding the data by using the arithmetic coding algorithm, so as to obtain an encoding interval;

re-extending the encoding interval of the data, so as to obtain a re-extended encoding interval; and continuing to encode the data according to the re-extended encoding interval by using the arithmetic coding algorithm, so as to obtain the code value interval.

9. The method according to claim 8, wherein the re-extending the encoding interval of the data, so as to obtain the re-extended encoding interval comprises:

re-extending the encoding interval of the data, when at least one first condition is met, so as to obtain the re-extended encoding interval and record a location of a corresponding re-extended character;

wherein the first condition is that a quantity of encoded characters of the data reaches a character quantity threshold or that a length of the encoding interval of the data is less than an interval threshold.

10. The method according to claim 1, further comprising performing, when a code value corresponding to the data exists in the code value interval, and before the obtaining the code value according to the code value interval:

determining whether an appropriate code value corresponding to the data exists in the code value interval; and storing the data when no appropriate code value corresponding to the data exists in the code value interval.

11. A data processing device, comprising:

a processor; and a non-transitory computer-readable storage medium storing a program to be executed by the processor, the program including instructions to:

encode data by using an arithmetic coding algorithm, so as to obtain a code value interval;

obtain, when a code value corresponding to the data exists in the code value interval, the code value according to the code value interval;

compare a quantity of bits of the code value with a quantity of bits of the data, so as to obtain a comparison result; and perform a storage operation according to the comparison result.

12. The device according to claim 11, wherein the comparison result is that the quantity of bits of the code value is greater than or equal to the quantity of bits of the data; and wherein the instructions to perform a storage operation include instructions to save the data according to the comparison result.

13. The device according to claim 11, wherein the comparison result is that the quantity of bits of the code value is less than the quantity of bits of the data; and wherein the instructions to perform a storage operation include instructions to save the code value according to the comparison result.

14. The device according to claim 13, wherein the program further includes instructions to perform an application operation of the data according to the code value, wherein the application operation comprises at least one of an equivalent comparison, sorting, or a fuzzy search.

15. The device according to claim 14, wherein the data is an identifier (ID) type string, and wherein the application operation comprises the equivalent comparison; and wherein the instructions to perform the application operation include instructions to determine that the data and data corresponding to a to-be-compared code value are the same data when the code value is equal to the to-be-compared code value.

16. The device according to claim 14, wherein the data is one of an identifier (ID) type string or a letter string of a field, and wherein the application operation comprises sorting; and wherein the instructions to perform the application operation include instructions to determine a location of the code value in a to-be-sorted code value according to the code value, and wherein the location of the code value is represents a location of the data in data corresponding to the to-be-sorted code value.

17. The device according to claim 14, wherein the application operation comprises the fuzzy search;
wherein the instructions to perform the application operation include instructions to determine, according to whether the code value falls within an encoding interval of a prefix string that needs to be fuzzily searched, whether the data comprises the prefix string;
wherein the data comprises the prefix string when the code value falls within the encoding interval of the prefix string that needs to be fuzzily searched; and
wherein the data omits the prefix string when the code value falls outside the encoding interval of the prefix string that needs to be fuzzily searched.

18. The device according to claim 11, wherein the instructions to encode the data includes instructions to:
encode the data by using the arithmetic coding algorithm, so as to obtain an encoding interval;
re-extend the encoding interval of the data, so as to obtain a re-extended encoding interval; and
continue to encode the data according to the re-extended encoding interval by using the arithmetic coding algorithm, so as to obtain the code value interval.

19. The device according to claim 18, wherein the instructions to encode the data include instructions to re-extends the encoding interval of the data when at least one first condition is met, so as to obtain the re-extended encoding interval and record a location of a corresponding re-extended character;
wherein the first condition is one of that a quantity of encoded characters of the data reaches a character quantity threshold, or that a length of the encoding interval of the data is less than an interval threshold.

20. The device according to claim 11, wherein the program further includes instructions to:
determine, before the obtaining the code value, whether an appropriate code value corresponding to the data exists in the code value interval; and
save the data when no appropriate code value corresponding to the data exists in the code value interval.

* * * * *